United States Patent
Shiraishi et al.

(10) Patent No.: US 12,542,531 B2
(45) Date of Patent: Feb. 3, 2026

(54) METHOD FOR MANUFACTURING VIBRATION ELEMENT

(71) Applicant: SEIKO EPSON CORPORATION, Tokyo (JP)

(72) Inventors: Shigeru Shiraishi, Ina (JP); Hiyori Sakata, Minowa (JP); Keiichi Yamaguchi, Ina (JP); Ryuta Nishizawa, Nagano (JP)

(73) Assignee: SEIKO EPSON CORPORATION (JP)

( * ) Notice: Subject to any disclaimer, the term of this patent is extended or adjusted under 35 U.S.C. 154(b) by 776 days.

(21) Appl. No.: 17/970,657

(22) Filed: Oct. 21, 2022

(65) Prior Publication Data

US 2023/0127801 A1 Apr. 27, 2023

(30) Foreign Application Priority Data

Oct. 22, 2021 (JP) ................................ 2021-172914

(51) Int. Cl.
| | |
|---|---|
| *H03H 9/00* | (2006.01) |
| *G01C 19/5628* | (2012.01) |
| *H03H 9/215* | (2006.01) |
| *H10N 30/082* | (2023.01) |
| *H10N 30/85* | (2023.01) |

(52) U.S. Cl.
CPC ......... *H03H 9/215* (2013.01); *G01C 19/5628* (2013.01); *H10N 30/082* (2023.02); *H10N 30/85* (2023.02)

(58) Field of Classification Search
CPC .. H03H 9/215; H03H 9/02157; H03H 9/2473; H03H 2003/022; H03H 2003/026; H03H 3/02; G01C 19/5628; H10N 30/082; H10N 30/85
See application file for complete search history.

(56) References Cited

U.S. PATENT DOCUMENTS

| | | | |
|---|---|---|---|
| 2013/0167341 A1* | 7/2013 | Kawashima | ........... H04R 31/00 29/25.35 |
| 2016/0126923 A1* | 5/2016 | Nakagawa | ......... G01C 19/5607 29/25.35 |

FOREIGN PATENT DOCUMENTS

| | | |
|---|---|---|
| JP | 2007-013382 A | 1/2007 |
| JP | 2008-205657 A | 9/2008 |
| JP | 2013-175933 A | 9/2013 |
| JP | 2018-148380 A | 9/2018 |

\* cited by examiner

*Primary Examiner* — Julio C. Gonzalez
(74) *Attorney, Agent, or Firm* — Harness, Dickey & Pierce, P.L.C.

(57) ABSTRACT

A method for manufacturing a vibration element includes, a base film forming step of forming a first base film at a first substrate surface of a quartz crystal substrate in first and second vibrating arm forming regions, a protective film forming step of forming a first protective film in a bank portion forming region of the first base film, and a dry-etching step of dry-etching the quartz crystal substrate through the first base film and the first protective film.

6 Claims, 17 Drawing Sheets

METHOD FOR MANUFACTURING VIBRATION ELEMENT

The present application is based on, and claims priority from JP Application Serial Number 2021-172914, filed Oct. 22, 2021, the disclosure of which is hereby incorporated by reference herein in its entirety.

BACKGROUND

1. Technical Field

The present disclosure relates to a method for manufacturing a vibration element.

2. Related Art

JP-A-2013-175933 discloses a method for forming a tuning fork type vibrator having a bottomed groove in a vibrating arm by wet-etching and dry-etching. In this manufacturing method, a quartz crystal substrate is wet-etched into an outer shape of the tuning fork type vibrator, and then the groove is formed by the dry-etching.

JP-A-2007-013382 discloses a method for forming a tuning fork type vibrator having a bottomed groove in a vibrating arm by dry-etching. In this manufacturing method, when a substrate made of a piezoelectric material is dry-etched, by using a micro loading effect, a width of the groove is narrowed with respect to a width between a pair of vibrating arms to make an etching depth of the groove smaller than an etching depth between the pair of vibrating arms, so that the groove and an outer shape of the vibrator are collectively formed.

In the manufacturing method of JP A-2013-175933, since the wet-etching for forming the outer shape and the dry-etching for forming the groove are separate steps, manufacturing steps are complicated, and displacement of the groove with respect to the outer shape, or the like is likely to occur. Therefore, there is a problem in that in a vibration element manufactured by this manufacturing method, unnecessary vibration or the like is likely to occur.

On the other hand, in the manufacturing method of JP A-2007-013382, since the outer shape and the groove are collectively formed in the same step, the above-described problem does not occur. However, in this manufacturing method, since the outer shape and the groove are collectively formed by the micro loading effect in the dry-etching, there is a problem that a setting of dimensions such as the width of the vibrating arm and the width and the depth of the groove is restricted, resulting in low degree of freedom in design.

Therefore, there is a demand for a method for manufacturing a vibration element capable of collectively forming an outer shape and a groove and having high degree of freedom in design.

SUMMARY

A method for manufacturing a vibration element according to an aspect of the present disclosure is a method for manufacturing a vibration element including: a first vibrating arm and a second vibrating arm extending along a first direction and arranged side by side along a second direction intersecting the first direction. The first vibrating arm and the second vibrating arm each have a first surface and a second surface arranged side by side in a third direction intersecting the first direction and the second direction in a front and back relationship and a bottomed groove opening to the first surface. The method for manufacturing a vibration element includes: a preparing step of preparing a quartz crystal substrate having a first substrate surface and a second substrate surface in a front and back relationship; a base film forming step of forming a first base film at the first substrate surface in a first vibrating arm forming region in which the first vibrating arm is to be formed and a second vibrating arm forming region in which the second vibrating arm is to be formed; a protective film forming step of forming a first protective film in a region of the first base film excluding a groove forming region in which the groove is to be formed; and a dry-etching step of dry-etching the quartz crystal substrate from a first substrate surface side through the first base film and the first protective film to form the first surfaces, the grooves, and outer shapes of the first vibrating arm and the second vibrating arm.

DESCRIPTION OF EXEMPLARY EMBODIMENTS

1. First Embodiment

A method for manufacturing a vibration element 1 according to a first embodiment will be described.

First, a configuration of the vibration element 1 will be described with reference to FIGS. 1 and 2, and then the method for manufacturing the vibration element 1 will be described with reference to FIGS. 3 to 14.

Figure 3:
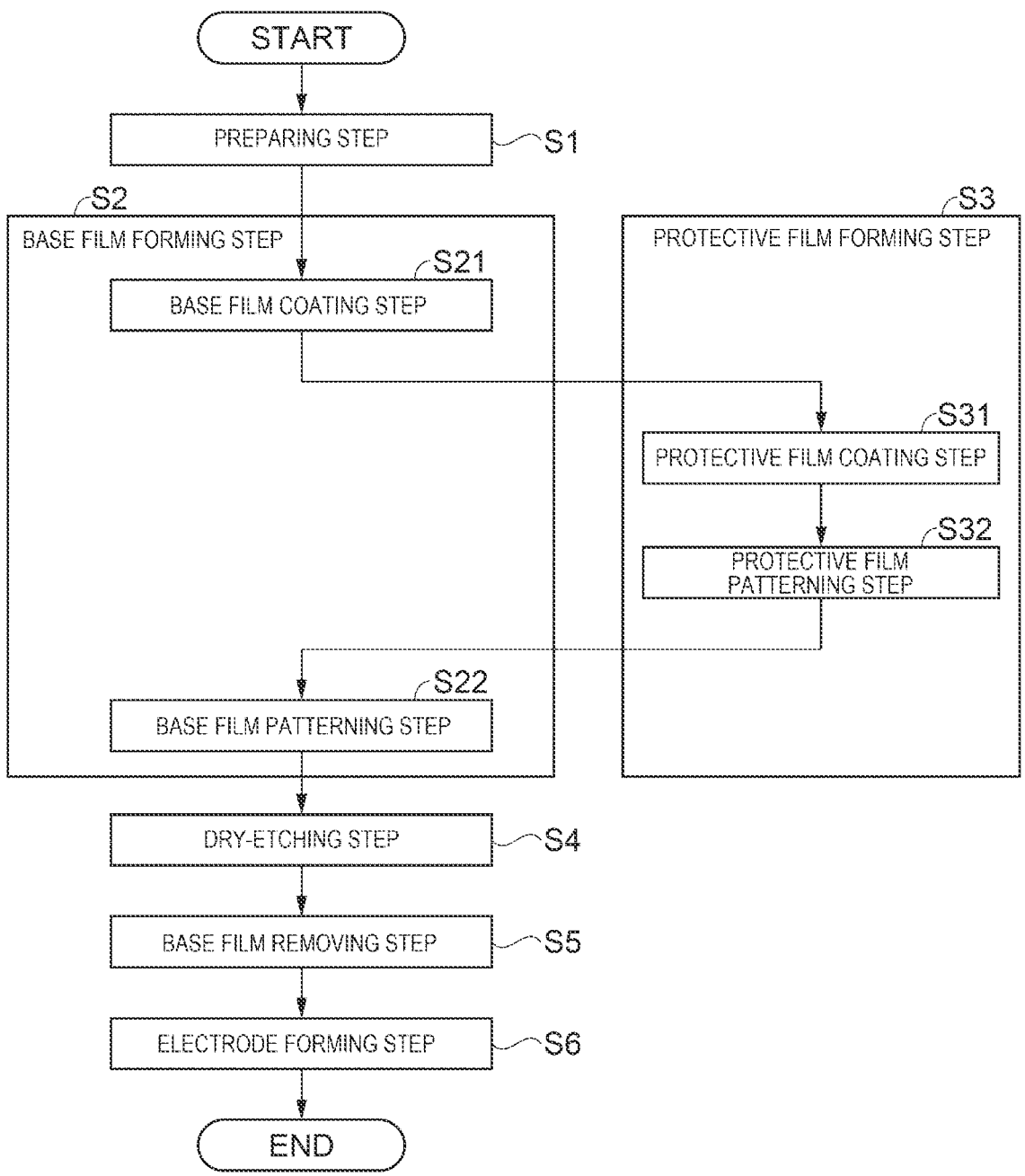
FIG. 3 is a diagram showing steps for manufacturing the vibration element according to the first embodiment.

For convenience of description, each figure except FIG. 3 shows three axes orthogonal to one another, that is, an X axis, a Y axis, and a Z axis. In addition, a direction along the X axis as a second direction is also referred to as an X direction, a direction along the Y axis as a first direction is also referred to as a Y direction, and a direction along the Z axis as a third direction is also referred to as a Z direction. An arrow side of each axis is also referred to a plus side, and an opposite side is also referred to a minus side. In addition, the plus side in the Z direction is also referred to as "upper", and the minus side is also referred to as "lower". In addition, a plan view from the Z direction is also simply referred to as a "plan view". In addition, the X axis, the Y axis, and the Z axis correspond to crystal axes of a quartz crystal, as will be described later.

Figure 1:
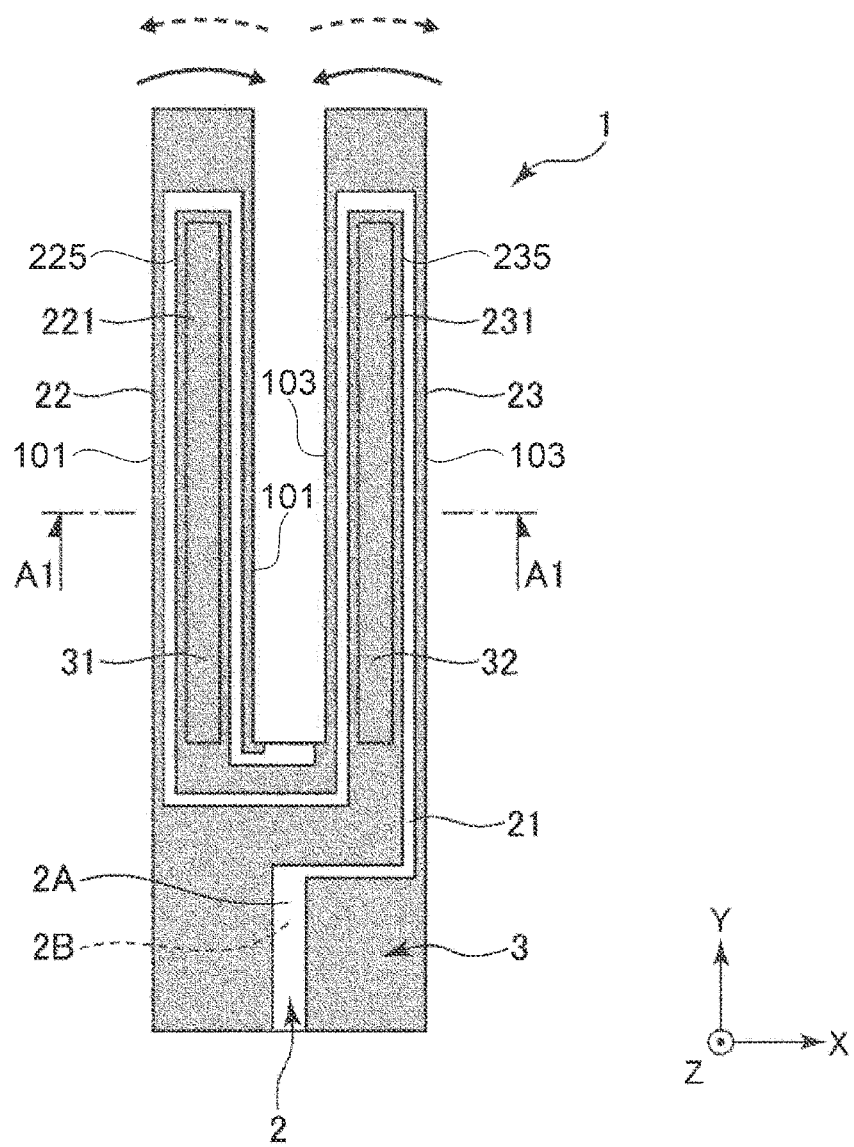
FIG. 1 is a plan view showing a vibration element according to a first embodiment.
Figure 2:
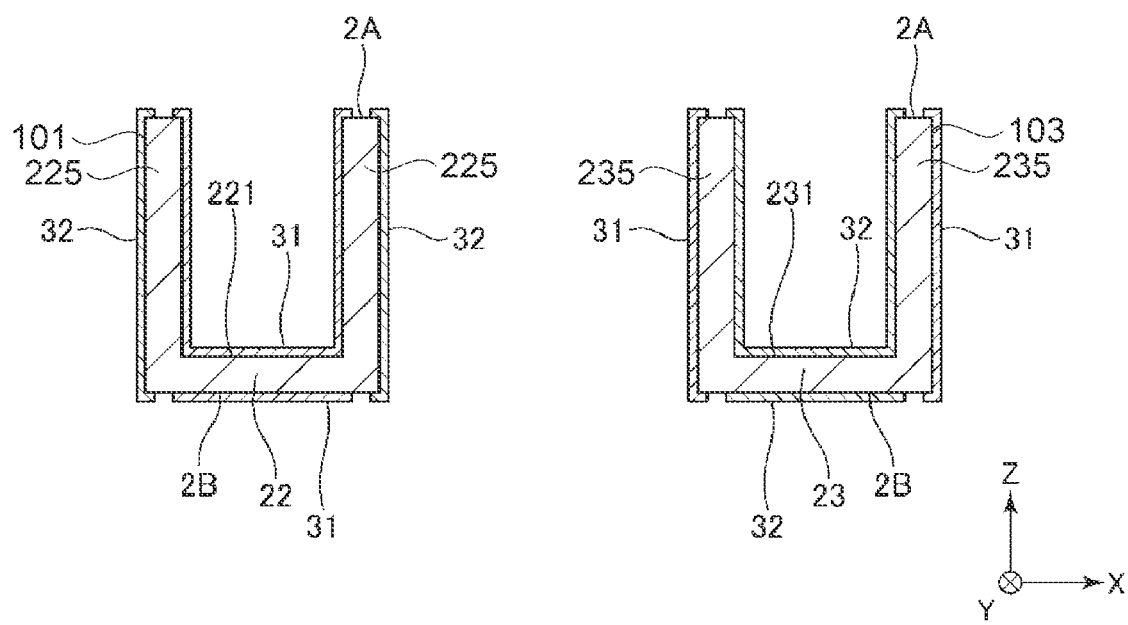
FIG. 2 is a cross-sectional view taken along a line A1-A1 in FIG. 1.

As shown in FIGS. 1 and 2, the vibration element 1 is a tuning fork type vibration element, and includes a vibration substrate 2 and an electrode 3 formed on a surface of the vibration substrate 2.

The vibration substrate 2 is formed by patterning a Z-cut quartz crystal substrate as a Z-cut quartz crystal plate into a desired shape, has a spread in an X-Y plane defined by the X axis and the Y axis which are the crystal axes of the quartz crystal, and has a thickness along the Z direction. The X axis is also referred to as an electrical axis, the Y axis is also referred to as a mechanical axis, and the Z axis is also referred to as an optical axis. In addition, the thickness along the Z direction is also simply referred to as a "thickness".

The vibration substrate 2 is formed in a plate shape, and has a first surface 2A and a second surface 2B which are arranged side by side in the Z direction in a mutual front and back relationship. The vibration substrate 2 includes a base portion 21, and a first vibrating arm 22 and a second vibrating arm 23 extending from the base portion 21 along the Y direction and arranged side by side along the X direction.

The first vibrating arm 22 includes a bottomed groove 221 that opens to the first surface 2A, a bank portion 225 that demarcates the groove 221, and a side surface 101 that couples the first surface 2A and the second surface 2B. The bank portion 225 is a portion arranged side by side on the first surface 2A in the plan view with the groove 221 interposed therebetween along the X direction.

Similarly, the second vibrating arm 23 includes a bottomed groove 231 that opens to the first surface 2A, a bank portion 235 that demarcates the groove 231, and a side surface 103 that couples the first surface 2A and the second surface 2B. The bank portion 235 is a portion arranged side by side on the first surface 2A in the plan view with the groove 231 interposed therebetween along the X direction.

The grooves 221, 231 extend along the Y direction. In addition, the bank portions 225, 235 are formed on both sides of the grooves 221, 231 in the X direction, respectively, and extend along the Y direction. Therefore, each of the first vibrating arm 22 and the second vibrating arm 23 has a substantially U-shaped cross-sectional shape. Accordingly, a thermoelasticity loss is reduced, and the vibration element 1 has an excellent vibration characteristic.

The electrode 3 includes signal electrodes 31 and ground electrodes 32. The signal electrodes 31 are disposed on the first surface 2A and the second surface 2B of the first vibrating arm 22 and the side surface 103 of the second vibrating arm 23. On the other hand, the ground electrodes 32 are disposed on the side surface 101 of the first vibrating arm 22 and the first surface 2A and the second surface 2B of the second vibrating arm 23. When a drive signal is applied to the signal electrodes 31 in a state where the ground electrodes 32 are grounded, as shown by arrows in FIG. 1, the first vibrating arm 22 and the second vibrating arm 23 perform flexural vibration in the X direction so as to repeatedly approach to and separate from each other.

The vibration element 1 is briefly described above.

Next, the method for manufacturing the vibration element 1 will be described. As shown in FIG. 3, the method for manufacturing the vibration element 1 includes: a preparing step S1 of preparing a quartz crystal substrate 20 which is a base material of the vibration substrate 2; a base film forming step S2 of forming a first base film 51 in a predetermined region of a first substrate surface 20A of the quartz crystal substrate 20; a protective film forming step S3 of forming a first protective film 53 in a predetermined region of the first base film 51; a dry-etching step S4 of dry-etching the quartz crystal substrate 20 from a first substrate surface 20A side through the first base film 51 and the first protective film 53; a base film removing step S5 of removing the first base film 51 remaining on the first substrate surface 20A of the quartz crystal substrate 20; and an electrode forming step S6 of forming the electrode 3 on a front surface of the vibration substrate 2 obtained by the above steps.

The base film forming step S2 includes a base film coating step S21 of coating the first substrate surface 20A of the quartz crystal substrate 20 with the first base film 51, and a base film patterning step S22 of patterning the first base film 51. The protective film forming step S3 includes a protective film coating step S31 of coating the first base film 51 with the first protective film 53, and a protective film patterning step S32 of patterning the first protective film 53.

Hereinafter, these steps will be described in order.

Preparing Step S1

Figure 4:
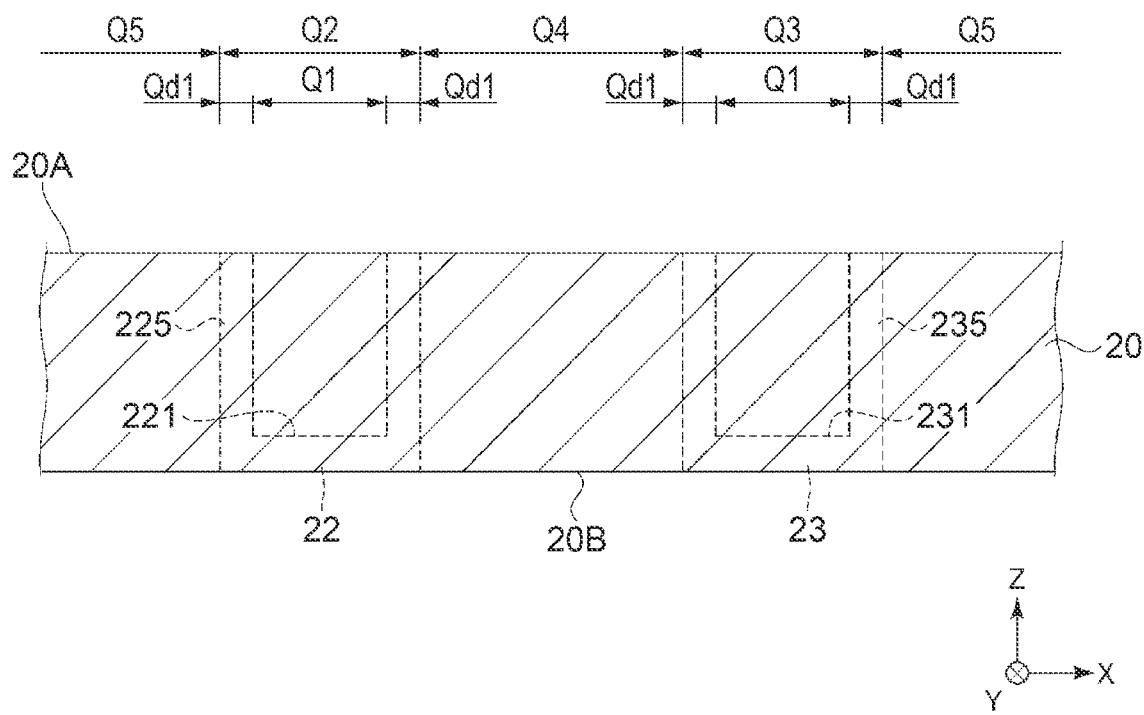
FIG. 4 is a cross-sectional view showing a method for manufacturing the vibration element.

As shown in FIG. 4, the quartz crystal substrate 20, which is the base material of the vibration substrate 2, is prepared. A plurality of vibration elements 1 are collectively formed from the quartz crystal substrate 20. The quartz crystal substrate 20 is formed in a plate shape, and has the first substrate surface 20A and the second substrate surface 20B which are arranged side by side in the Z direction in a mutual front and back relationship. The quartz crystal substrate 20 is adjusted to a desired thickness by polishing treatment such as lapping or polishing, and the first substrate surface 20A and the second substrate surface 20B are sufficiently smoothed. In addition, if necessary, the quartz crystal substrate 20 may be subjected to a surface treatment by wet etching.

Hereinafter, a region in which the first vibrating arm 22 is to be formed by the dry-etching step S4 to be described later is also referred to as a first vibrating arm forming region Q2. Similarly, a region in which the second vibrating arm 23 is to be formed by the dry-etching step S4 is also referred to as a second vibrating arm forming region Q3. A region located between the first vibrating arm forming region Q2 and the second vibrating arm forming region Q3 is also referred to as an inter-arm region Q4. In addition, a region located between adjacent vibration substrates 2 is also referred to as an inter-element region Q5.

The first vibrating arm forming region Q2 and the second vibrating arm forming region Q3 include groove forming regions Q1 in which the grooves 221, 231 are respectively formed, and bank portion forming regions Qd1 in which the bank portions 223, 235 are respectively formed. In other words, the bank portion forming regions Qd1 correspond to regions of the first vibrating arm forming region Q2 and the second vibrating arm forming region Q3 excluding the groove forming regions Q1. The grooves 221, 231 and the bank portions 225, 235 are formed by the dry-etching step S4.

Base Film Coating Step S21

Figure 5:
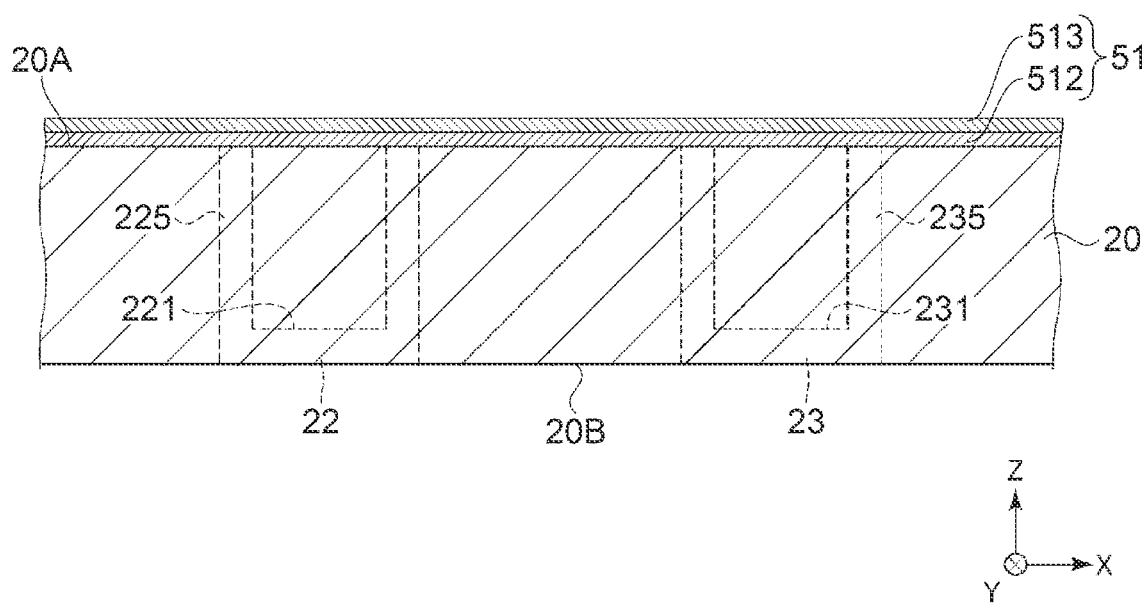
FIG. 5 is a cross-sectional view showing the method for manufacturing the vibration element.

As shown in FIG. 5, the first substrate surface 20A of the quartz crystal substrate 20 is coated with the first base film 51. The first base film 51 is formed of a material that is etched at a predetermined etching rate in the dry-etching step S4 to be described later.

In the present embodiment, the first base film 51 is a metal film formed of metal. Specifically, the first base film 51 is formed by stacking a first metal film 512 and a second metal film 513. The first metal film 512 is formed on the first substrate surface 20A of the quartz crystal substrate 20. The second metal film 513 is formed on a surface of the first metal film 512 on a side opposite to the quartz crystal substrate 20. The surface of the first metal film 512 on the side opposite to the quartz crystal substrate 20 is a surface of the first metal film 512 on the plus side in the Z direction. The first metal film 512 is formed of chromium (Cr). The second metal film 513 is formed of copper (Cu).

In the present embodiment, the first base film 51 is formed by stacking the first metal film 512 and the second metal film 513, but the disclosure is not limited thereto, and the first base film 51 may be formed of one film, or may be formed by stacking three or more films.

The first base film 51 may be formed of a material other than metal. For example, the first base film 51 may be a resist film formed of a resist material.

Protective Film Coating Step S31

Figure 6:
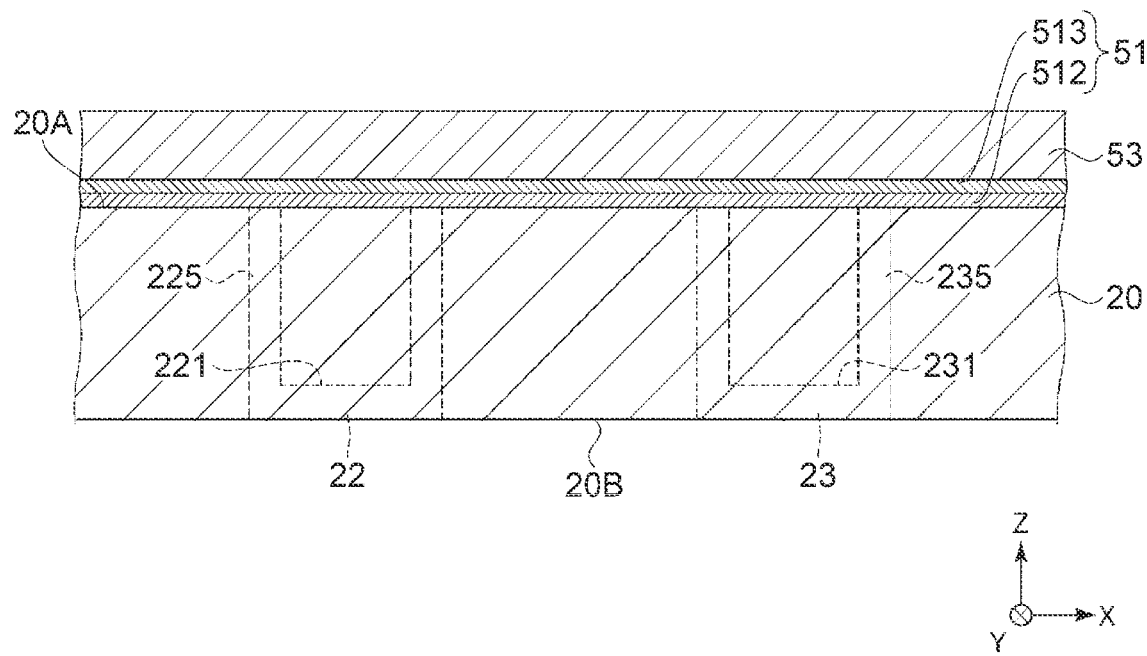
FIG. 6 is a cross-sectional view showing the method for manufacturing the vibration element.

As shown in FIG. 6, the first base film 51 is coated with the first protective film 53. The first protective film 53 is formed on a surface of the first base film 51 on the side opposite to the quartz crystal substrate 20. The surface of the first base film 51 on the side opposite to the quartz crystal substrate 20 is a surface of the first base film 51 on the plus side in the Z direction. The first protective film 53 is formed of a material that is etched at a predetermined etching rate in the dry-etching step S4 to be described later.

In the present embodiment, the first protective film 53 is a metal film formed of metal. As the metal forming the first protective film 53, for example, nickel (Ni) can be used. The first protective film 53 may be formed of a material other than metal. For example, the first protective film 53 may be a resist film formed of a resist material.

Protective Film Patterning Step S32

Figure 7:
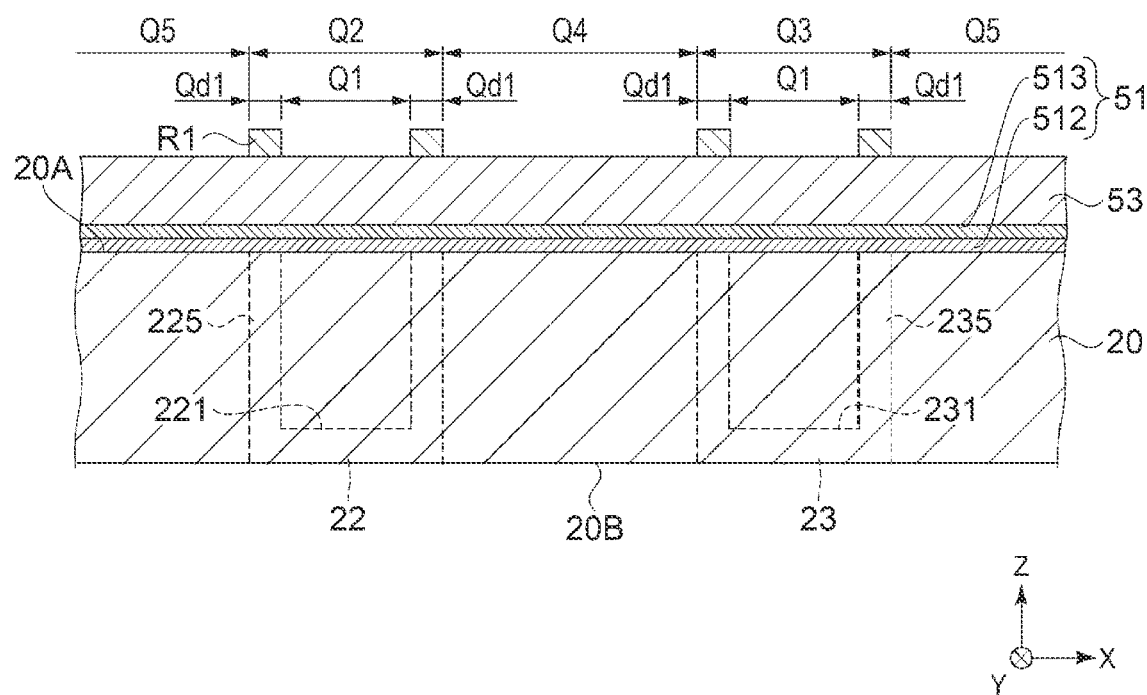
FIG. 7 is a cross-sectional view showing the method for manufacturing the vibration element.

First, as shown in FIG. 7, a first resist film R1 is formed on a surface of the first protective film 53 on the side opposite to the quartz crystal substrate 20. The surface of the first protective film 53 on the side opposite to the quartz crystal substrate 20 is a surface of the first protective film 53 on the plus side in the Z direction. The first resist film R1 is formed in the bank portion forming regions Qd1 by a photolithographic technique. That is, the first resist film R1 overlaps the bank portion forming regions Qd1 in the plan view.

Next, the first protective film 53 is etched from a surface side of the first protective film 53 on which the first resist film R1 is formed. That is, the first protective film 53 is etched from a surface side of the first protective film 53 on the plus side in the Z direction using the first resist film R1 as a mask. As a result, the first protective film 53 in the groove forming regions Q1, the inter-arm region Q4, and the inter-element regions Q5 in which the first resist film R1 is not formed is removed.

Figure 8:
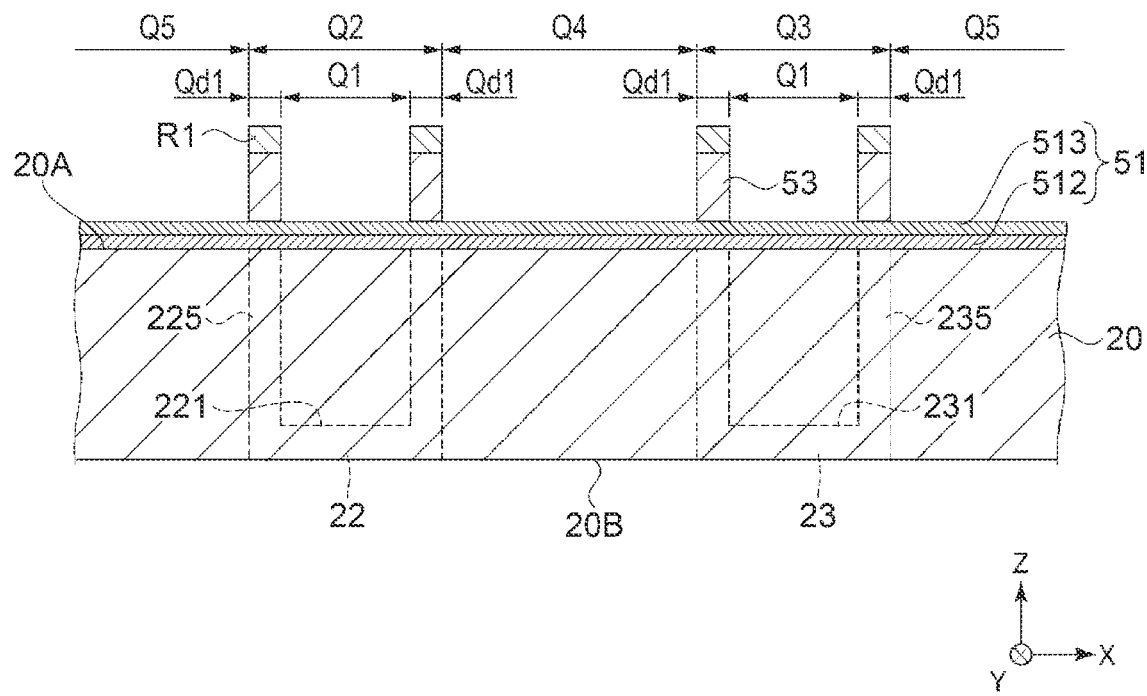
FIG. 8 is a cross-sectional view showing the method for manufacturing the vibration element.

In this manner, as shown in FIG. 8, the first protective film 53 can be formed in the bank portion forming regions Qd1 which are the predetermined regions of the first base film 51.

Figure 9:
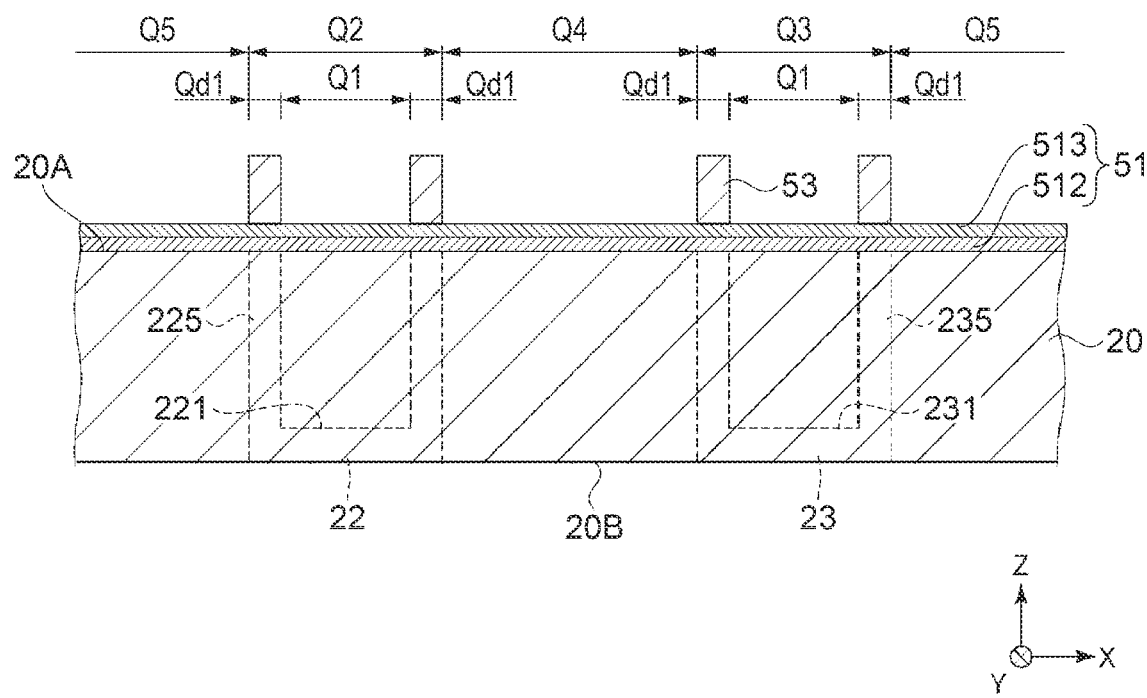
FIG. 9 is a cross-sectional view showing the method for manufacturing the vibration element.

Next, as shown in FIG. 9, the first resist film R1 is removed, and the process proceeds to the base film patterning step S22.

Base Film Patterning Step S22

The base film patterning step S22 includes a step of forming a second resist film R2 in the first vibrating arm forming region Q2 and the second vibrating arm forming region Q3, and a step of etching the first base film 51 using the second resist film R2 as a mask.

Figure 10:
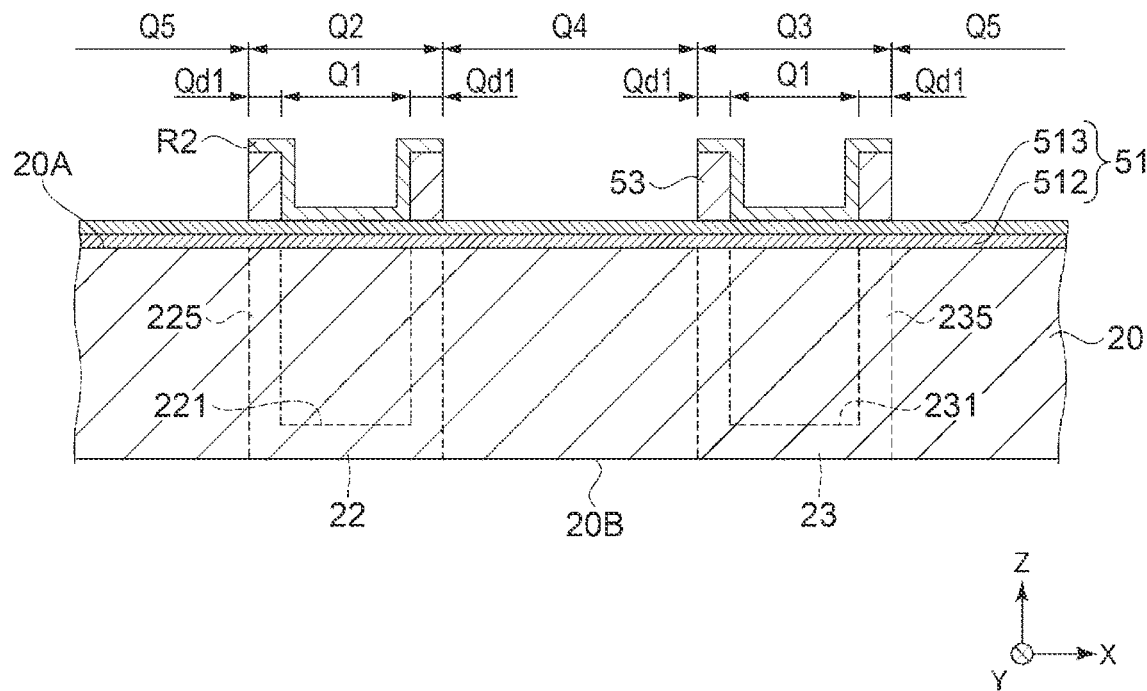
FIG. 10 is a cross-sectional view showing the method for manufacturing the vibration element.

First, as shown in FIG. 10, the second resist film R2 is formed in the first vibrating arm forming region Q2 and the second vibrating arm forming region Q3 of the surface of the first base film 51 on the side opposite to the quartz crystal substrate 20 by the photolithographic technique.

In the present embodiment, the protective film coating step S31 and the protective film patterning step S32 are performed before the base film patterning step S22, and the first protective film 53 is formed in the bank portion forming regions Qd1 of the first vibrating arm forming region Q2 and the second vibrating arm forming region Q3. Therefore, in the bank portion forming regions Qd1, the second resist film R2 is formed on the surface of the first base film 51 on the side opposite to the quartz crystal substrate 20 through the first protective film 53. Further, in the groove forming regions Q1 of the first vibrating arm forming region Q2 and the second vibrating arm forming region Q3, the second resist film R2 is formed on the surface of the first base film 51 on the side opposite to the quartz crystal substrate 20 without the first protective film 53 interposed therebetween.

Next, the first base film 51 is etched from a surface side of the first base film 51 on which the second resist film R2 is formed. That is, the first base film 51 is etched from a surface side of the first base film 51 on the plus side in the Z direction using the second resist film R2 as a mask.

In the present embodiment, the step of etching the first base film 51 using the second resist film R2 as the mask includes a step of etching the first metal film 512 of the first base film 51 and a step of etching the second metal film 513 of the first base film 51. In the base film patterning step S22, first, the second metal film 513 formed on the surface of the first metal film 512 on the side opposite to the quartz crystal substrate 20 is etched, and then the first metal film 512 is etched. In this manner, the first base film 51 formed by stacking the first metal film 512 and the second metal film 513 can be etched.

Since the second resist film R2 is formed in the first vibrating arm forming region Q2 and the second vibrating arm forming region Q3, the first base film 51 in the inter-arm region Q4 and the inter-element regions Q5 in which the second resist film R2 is not formed is removed in the base film patterning step S22.

Figure 11:
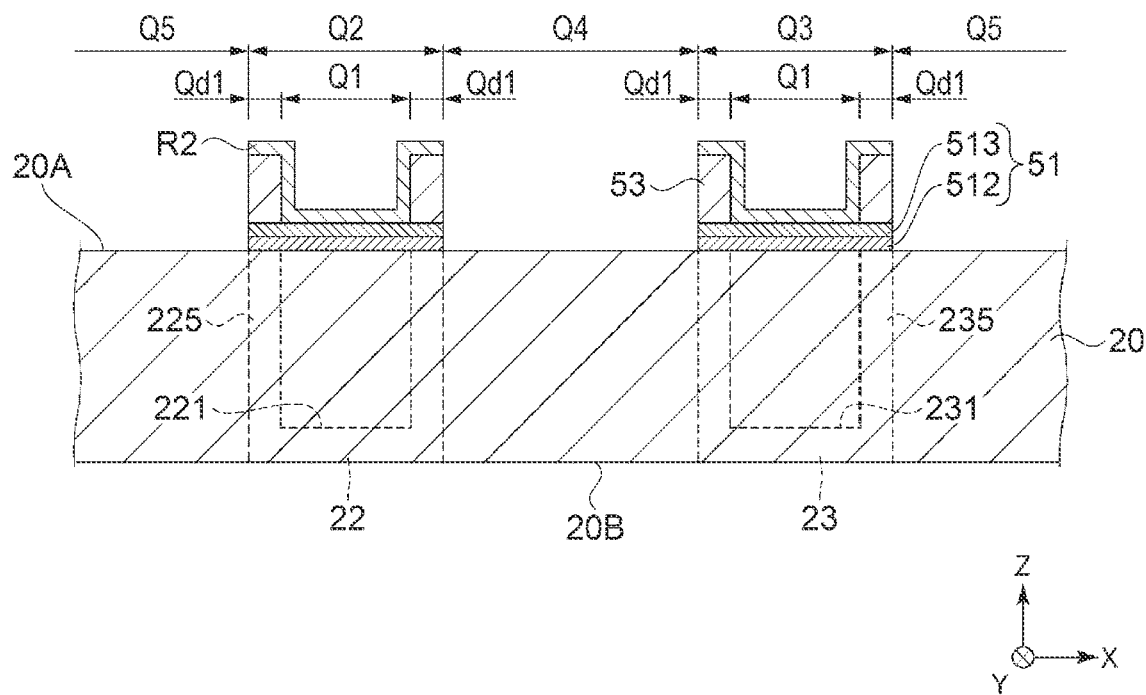
FIG. 11 is a cross-sectional view showing the method for manufacturing the vibration element.

In this manner, as shown in FIG. 11, the first base film 51 is formed in the first vibrating arm forming region Q2 and the second vibrating arm forming region Q3 which are predetermined regions of the first substrate surface 20A of the quartz crystal substrate 20.

That is, by the base film forming step S2 including the base film coating step S21 and the base film patterning step S22, the first base film 51 is formed in the first vibrating arm forming region Q2 in which the first vibrating arm 22 is formed and the second vibrating arm forming region Q3 in which the second vibrating arm 23 is formed on the first substrate surface 20A of the quartz crystal substrate 20.

In addition, by the protective film forming step S3 including the protective film coating step S31 and the protective film patterning step S32, the first protective film 53 is formed in the bank portion forming regions Qd1 which are sub-regions of the first vibrating arm forming region Q2 and the second vibrating arm forming region Q3, in which the first base film 51 is formed, excluding the groove forming regions Q1.

In the present embodiment, the base film coating step S21, the base film patterning step S22, the protective film coating step S31, and the protective film patterning step S32 are performed in an order of the base film coating step S21, the protective film coating step S31, the protective film patterning step S32, and the base film patterning step S22. However, the order of performing the base film coating step S21, the base film patterning step S22, the protective film coating step S31, and the protective film patterning step S32 is not limited thereto. For example, the base film coating step S21, the base film patterning step S22, the protective film coating step S31, and the protective film patterning step S32 may be performed in order, or the base film coating step S21, the protective film coating step S31, the base film patterning step S22, and the protective film patterning step S32 may be performed in order.

Figure 12:
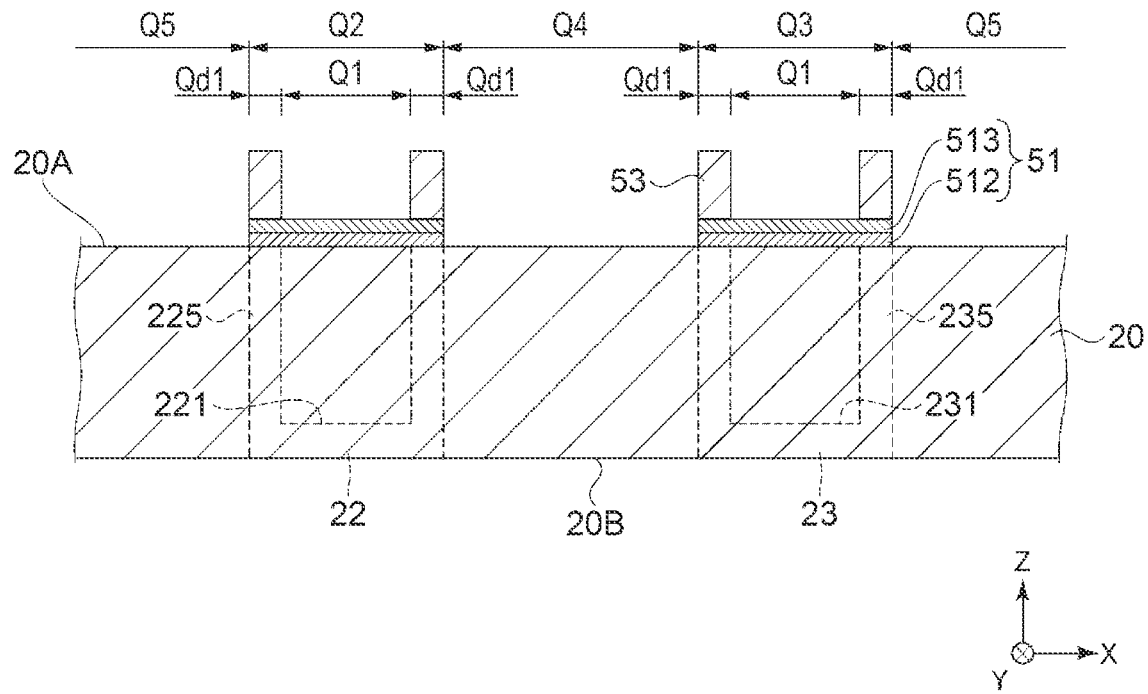
FIG. 12 is a cross-sectional view showing the method for manufacturing the vibration element.

Next, as shown in FIG. 12, the second resist film R2 is removed, and the process proceeds to the dry-etching step S4.

Dry-Etching Step S4

Figure 13:
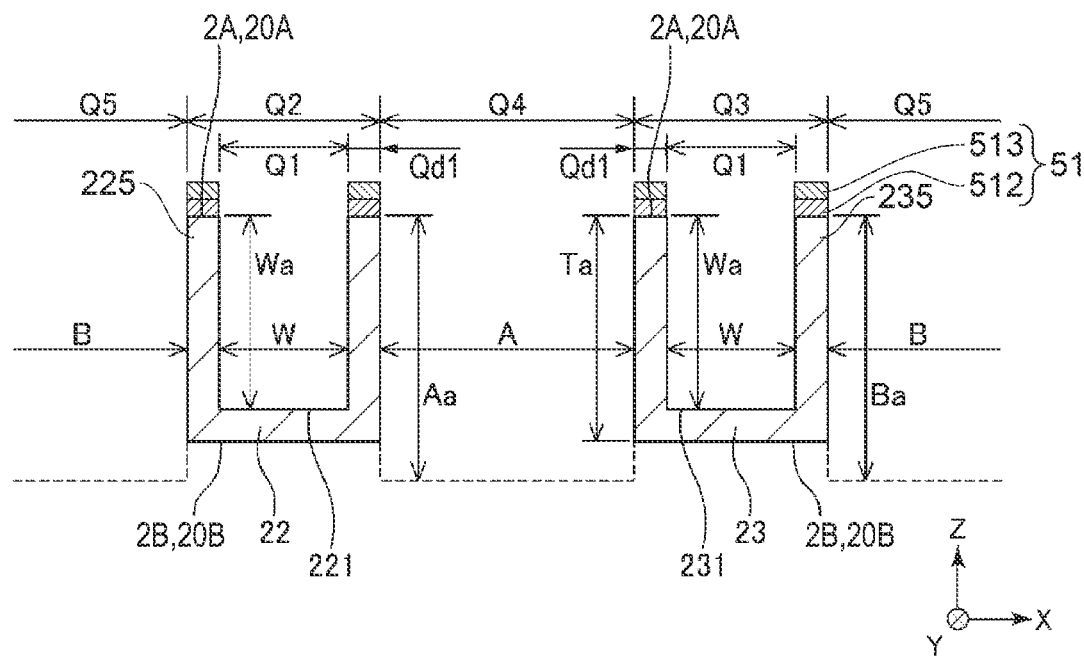
FIG. 13 is a cross-sectional view showing the method for manufacturing the vibration element.

As shown in FIG. 13, the quartz crystal substrate 20 is dry-etched from the first substrate surface 20A side through the first base film 51 and the first protective film 53, so that the first surface 2A, the grooves 221, 231, and an outer shape of the vibration substrate 2 are simultaneously formed. Further, the "simultaneously formed" means that the first surface 2A, the first grooves 221, 231, and the outer shape of the vibration substrate 2 are collectively formed in one step. More specifically, the dry-etching in this step is reactive ion etching, and is performed using a reactive ion etching device (RIE device). A reaction gas introduced into the RIE device is not particularly limited, and for example, $SF_6$, $CF_4$, $C_2F_4$, $C_2F_6$, $C_3F_6$, and $C_4F_8$ can be used.

In the dry-etching step S4, the first base film 51 and the first protective film 53 formed on the first substrate surface 20A of the quartz crystal substrate 20 are etched at respective predetermined etching rates. Therefore, respective etching depths of the quartz crystal substrate 20 in a region where the first base film 51 and the first protective film 53 are not formed and the first substrate surface 20A is exposed, a region where the first base film 51 is formed, and a region where the first base film 51 and the first protective film 53 are formed can be controlled by the first base film 51 and the first protective film 53.

In the present embodiment, the first base film 51 and the first protective film 53 are not formed in the inter-arm region Q4 or the inter-element regions Q5 of the first substrate surface 20A of the quartz crystal substrate 20. That is, in the inter-arm region Q4 and the inter-element regions Q5, the first substrate surface 20A of the quartz crystal substrate 20 is exposed. Therefore, the dry-etching step S4 is started, and etching performed on the quartz crystal substrate 20 is started in the inter-arm region Q4 and the inter-element regions Q5. By etching the inter-arm region Q4 and the inter-element regions Q5 of the first substrate surface 20A, the outer shape of the vibration substrate 2 is formed.

The first base film 51 is formed in the groove forming regions Q1 of the first substrate surface 20A of the quartz crystal substrate 20. Therefore, when the dry-etching step S4 is started, first, etching performed on the first base film 51 is started. Then, by removing the first base film 51, the first substrate surface 20A of the quartz crystal substrate 20 is exposed, and etching performed on the quartz crystal substrate 20 is started. The groove forming regions Q1 of the first substrate surface 20A are etched to form the grooves 221, 231. Since the start of the etching performed on the quartz crystal substrate 20 in the groove forming regions Q1 is later than the start of the etching performed on the quartz crystal substrate 20 in the inter-arm region Q4 and the inter-element regions Q5, an etching depth of the quartz crystal substrate 20 in the groove forming regions Q1 is smaller than an etching depth of the quartz crystal substrate 20 in the inter-arm region Q4 and the inter-element regions Q5.

The first base film 51 and the first protective film 53 are formed in the bank portion forming regions Qd1 of the first substrate surface 20A of the quartz crystal substrate 20. Therefore, when the dry-etching step S4 is started, first, etching performed on the first protective film 53 is started. Next, by removing the first protective film 53, etching performed on the first base film 51 is started. Then, by removing the first base film 51, the first substrate surface 20A of the quartz crystal substrate 20 is exposed, and etching performed on the quartz crystal substrate 20 is started. Therefore, the start of the etching performed on the first substrate surface 20A of the quartz crystal substrate 20 in the bank portion forming regions Qd1 is later than that in the groove forming regions Q1. That is, an etching depth of the quartz crystal substrate 20 in the bank portion forming regions Qd1 is smaller than an etching depth of the quartz crystal substrate 20 in the groove forming regions Q1.

In the present embodiment, since a thickness of the first protective film 53 is sufficiently increased, the dry-etching step S4 is ended in a state where the first base film 51 remains in the bank portion forming regions Qd1 of the first substrate surface 20A. That is, the bank portion forming regions Qd1 of the first substrate surface 20A are protected by the first base film 51. Therefore, in the present embodiment, the bank portion forming regions Qd1 of the first substrate surface 20A are not etched.

Further, in the present embodiment, the first protective film 53 is removed when the dry-etching step S4 is ended, and the first protective film 53 may not be removed.

The dry-etching step S4 ends when the grooves 221, 231 have a desired depth. The etching depth of the quartz crystal substrate 20 in the groove forming regions Q1 is a depth Wa of the grooves 221, 231. The etching depth of the quartz crystal substrate 20 in the inter-arm region Q4 is a depth Aa of the outer shape of the vibration substrate 2. The etching depth of the quartz crystal substrate 20 in the inter-element regions Q5 is a depth Ba of the outer shape of the vibration substrate 2.

As described above, the etching depth of the quartz crystal substrate 20 in the groove forming regions Q1 is smaller than the etching depth of the quartz crystal substrate 20 in the inter-arm region Q4 and the inter-element regions Q5. Therefore, the depths Aa, Ba of the outer shape of the vibration substrate 2 are larger than the depth Wa of the grooves 221, 231. That is, Wa<Aa and Wa<Ba. The depths Aa, Ba are each equal to or greater than a thickness Ta of the quartz crystal substrate 20. That is, Aa≥Ta and Ba≥Ta. By setting the depths Aa, Ba to be equal to or greater than the thickness Ta of the quartz crystal substrate 20, the inter-arm region Q4 and the inter-element regions Q5 are each penetrated in the dry-etching step S4. The first vibrating arm 22 and the second vibrating arm 23 are formed by the inter-arm region Q4 and the inter-element regions Q5 being penetrated.

As described above, in the base film forming step S2, the first base film 51 is formed in the first vibrating arm forming region Q2 and the second vibrating arm forming region Q3 of the first substrate surface 20A of the quartz crystal substrate 20, and further, in the protective film forming step S3, the first protective film 53 is formed in the bank portion forming regions Qd1 which are the regions of the first vibrating arm forming region Q2 and the second vibrating arm forming region Q3, in which the first base film 51 is formed, excluding the groove forming regions Q1. Therefore, in the dry-etching step S4, outer shapes of the first and second vibrating arms 22, 23 and the grooves 221, 231 can be collectively formed without using a micro loading effect. Since dimensions of the first and second vibrating arms 22, 23, the grooves 221, 231, and the like can be controlled by adjusting thicknesses and widths of the first base film 51 and the first protective film 53, there is no restriction on a setting of dimensions such as a width A of the inter-arm region Q4 in the X direction, a width B of the inter-element region Q5 in the X direction, and a width W of each of the grooves 221, 231 in the X direction, and degree of freedom in design of the vibration element 1 can be improved.

In addition, since the micro loading effect is not used, restrictions on dry-etching conditions such as selection of the reaction gas used in the dry-etching are relieved, and thus the vibration element 1 can be easily manufactured as compared with a case where the micro loading effect is used.

As described above, in the present embodiment, in the dry-etching step S4, the dry-etching is ended in a state where the first base film 51 remains on the first substrate surface 20A of the quartz crystal substrate 20 in the bank portion forming regions Qd1. That is, the first substrate surface 20A of the quartz crystal substrate 20 in the bank portion forming regions Qd1 is not etched in the dry-etching step S4. The first substrate surface 20A of the quartz crystal substrate 20 in the bank portion forming regions Qd1 becomes the first surface 2A of the first and second vibrating arms 22, 23 in the base film removing step S5 to be described later. The "state where the first base film 51 remains" means a "state where at least a portion of the first base film 51 remains". For example, in the present embodiment, when the dry-etching is ended in the dry-etching step S4, the first metal film 512 and the second metal film 513 constituting the first base film 51 remain on the quartz crystal substrate 20, but the second metal film 513 may be removed.

In the present embodiment, in the dry-etching step S4, the dry-etching is ended in the state where the first base film 51 remains on the first substrate surface 20A of the quartz crystal substrate 20 in the bank portion forming regions Qd1, but the dry-etching may be ended in a state where the first base film 51 does not remain on the first substrate surface 20A of the quartz crystal substrate 20 in the bank portion forming regions Qd1. That is, the first substrate surface 20A of the quartz crystal substrate 20 in the bank portion forming regions Qd1 may be etched in the dry-etching step S4. In this case, a surface of the quartz crystal substrate 20 etched in the dry-etching step S4 becomes the first surface 2A of the first and second vibrating arms 22, 23.

In this manner, the first surface 2A is formed by etching the bank portion forming regions Qd1 of the first substrate surface 20A or by not etching the bank portion forming regions Qd1.

As described above, in the present embodiment, the first base film 51 and the first protective film 53 are not formed in the inter-arm region Q4 or the inter-element regions Q5. Therefore, along with the start of the dry-etching in the dry-etching step S4, the etching performed on the quartz crystal substrate 20 in the inter-arm region Q4 and the inter-element regions Q5 is started. Therefore, the dry-etching step S4 can be performed in a short time.

As described above, in the present embodiment, the first base film 51 is a metal film formed of metal. In general, an etching rate of metal is lower than an etching rate of a resist material. Therefore, by using the metal film as the first base film 51, the thickness of the first base film 51 can be made smaller than that of the resist film. Accordingly, dimensional accuracy of the first and second vibrating arms 22, 23, the grooves 221, 231, and the like formed in the dry-etching step S4 can be improved.

As described above, in the present embodiment, the first protective film 53 is a metal film formed of metal. Therefore, by using the metal film as the first protective film 53, the thickness of the first protective film 53 can be made smaller than that of the resist film. Accordingly, the dimensional accuracy of the first and second vibrating arms 22, 23, the grooves 221, 231, and the like formed in the dry-etching step S4 can be further improved.

Base Film Removing Step S5

Figure 14:
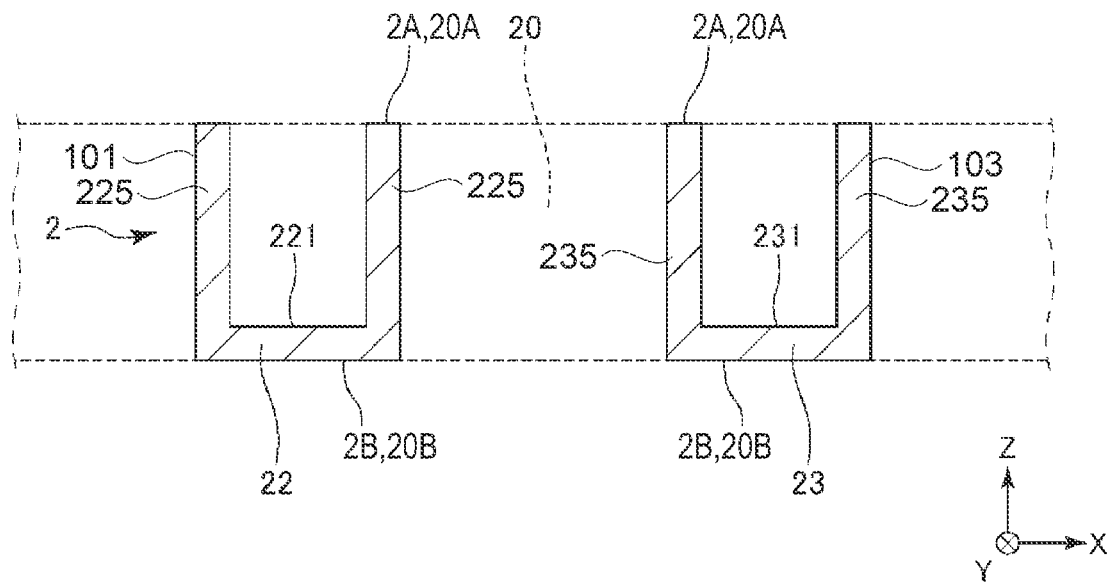
FIG. 14 is a cross-sectional view showing the method for manufacturing the vibration element.

As shown in FIG. 14, the first base film 51 remaining on the first substrate surface 20A of the quartz crystal substrate 20 in the bank portion forming regions Qd1 is removed. As a result, the first substrate surface 20A of the quartz crystal substrate 20 becomes the first surface 2A of the first and second vibrating arms 22, 23. That is, since the first surface 2A of the first and second vibrating arms 22, 23 is not etched in the dry-etching step S4, a thickness of each of the first and second vibrating arms 22, 23 and surface roughness of the first surface 2A in the bank portion forming regions Qd1 are maintained as the thickness of the quartz crystal substrate 20 and surface roughness of the first substrate surface 20A. Therefore, the thickness accuracy of the first and second vibrating arms 22, 23 is improved, and the occurrence of the unnecessary vibration such as the torsional vibration is prevented.

In the dry-etching step S4 described above, when the dry-etching is ended in the state where the first base film 51 does not remain on the first substrate surface 20A of the quartz crystal substrate 20, the base film removing step S5 may not be provided.

When the dry-etching step S4 described above is ended and the first protective film 53 is not removed, the first base film 51 and the first protective film 53 may be collectively removed in the base film removing step S5. Alternatively, a first protective film removing step of removing the first protective film 53 may be provided before the base film removing step S5 is performed.

By the above steps S1 to S5, as shown in FIG. 14, a plurality of vibration substrates 2 are collectively formed from the quartz crystal substrate 20.

Electrode Forming Step S6

A metal film is formed on a front surface of the vibration substrate 2 and is patterned to form the electrode 3.

As described above, the vibration element 1 is obtained.

As described above, according to the dry-etching, the processing can be performed without being affected by crystal planes of quartz crystal, and thus high dimensional accuracy can be achieved. The grooves 221, 231 and the outer shape of the vibration substrate 2 are collectively formed, so that steps for manufacturing the vibration element 1 can be reduced and a cost of the vibration element 1 can be reduced. Displacement of the grooves 221, 231 with respect to the outer shape is prevented, and forming accuracy of the vibration substrate 2 is improved.

The method for manufacturing the vibration element 1 is described above. However, the present disclosure is not limited thereto. A configuration of each part can be replaced with any configuration having the same function. In addition, any other constituents may be added to the present disclosure.

For example, the vibration element 1 may further include bottomed grooves that open to the second surface 2B in addition to the bottomed grooves 221, 231 of the first vibration arm 22 and the second vibration arm 23 that open to the first surface 2A. That is, the method for manufacturing the vibration element 1 can also be applied to a vibration element having bottomed grooves of the first vibration arm 22 and the second vibration arm 23 on each of the first surface 2A and second surface 2B.

As described above, according to the present embodiment, following effects can be obtained.

The method for manufacturing the vibration element 1 is provided. The vibration element 1 includes: the first vibrating arm 22 and the second vibrating arm 23 extending along the Y direction as the first direction and arranged side by side along the X direction as the second direction intersecting the Y direction. The first vibrating arm 22 and the second vibrating arm 23 each have the first surface 2A and the second surface 2B arranged side by side in the Z direction intersecting the Y direction and the X direction in the front and back relationship, and respectively have the bottomed grooves 221, 231 opening to the first surface 2A. The method for manufacturing the vibration element 1 includes: the preparing step S1 of preparing the quartz crystal substrate 20 having the first substrate surface 20A and the second substrate surface 20B in the front and back relationship; the base film forming step S2 of forming the first base film 51 on the first substrate surface 20A in the first vibrating arm forming region Q2 in which the first vibrating arm 22 is to be formed and the second vibrating arm forming region Q3 in which the second vibrating arm 23 is to be formed; the protective film forming step S3 of forming the first protective film 53 in the bank portion forming regions Qd1 which are the regions of the first base film 51 excluding the groove forming regions Q1 in which the first grooves 221, 231 are to be formed; and the dry-etching step S4 of dry-etching the quartz crystal substrate 20 from the first substrate surface 20A side through the first base film 51 and the first protective film 53 to form the first surface 2A, the grooves 221, 231, and the outer shapes of the first vibrating arm 22 and the second vibrating arm 23.

As a result, the outer shapes of the first and second vibrating arms 22, 23, and the grooves 221, 231 can be collectively formed, and there is no restriction on the setting of dimensions such as the width A of the inter-arm region Q4 in the X direction, the width B of the inter-element region Q5 in the X direction, and the width W of each of the grooves 221, 231 in the X direction, so that it is possible to provide a method for manufacturing the vibration element 1 having high degree of freedom in design.

2. Second Embodiment

A method for manufacturing the vibration element 1 according to a second embodiment will be described with reference to FIGS. 15 and 16. The same components as those of the first embodiment are denoted by the same reference numerals, and redundant description thereof will be omitted.

The second embodiment is the same as the first embodiment except that the protective film forming step S3 includes a step of forming the second resist film R2 in the base film patterning step S22, and that the second resist film R2 is used as a second protective film 55 without removing the second resist film R2 in the base film patterning step S22.

In other words, the second embodiment is the same as the first embodiment except that the dry-etching in the dry-etching step S4 is started in a state where the second resist film R2 is formed.

The preparing step S1, the base film coating step S21, the protective film coating step S31, and the protective film patterning step S32 are the same as those in the first embodiment, and thus the description thereof is omitted, and the method will be described from the base film patterning step S22.

Base Film Patterning Step S22

Figure 15:
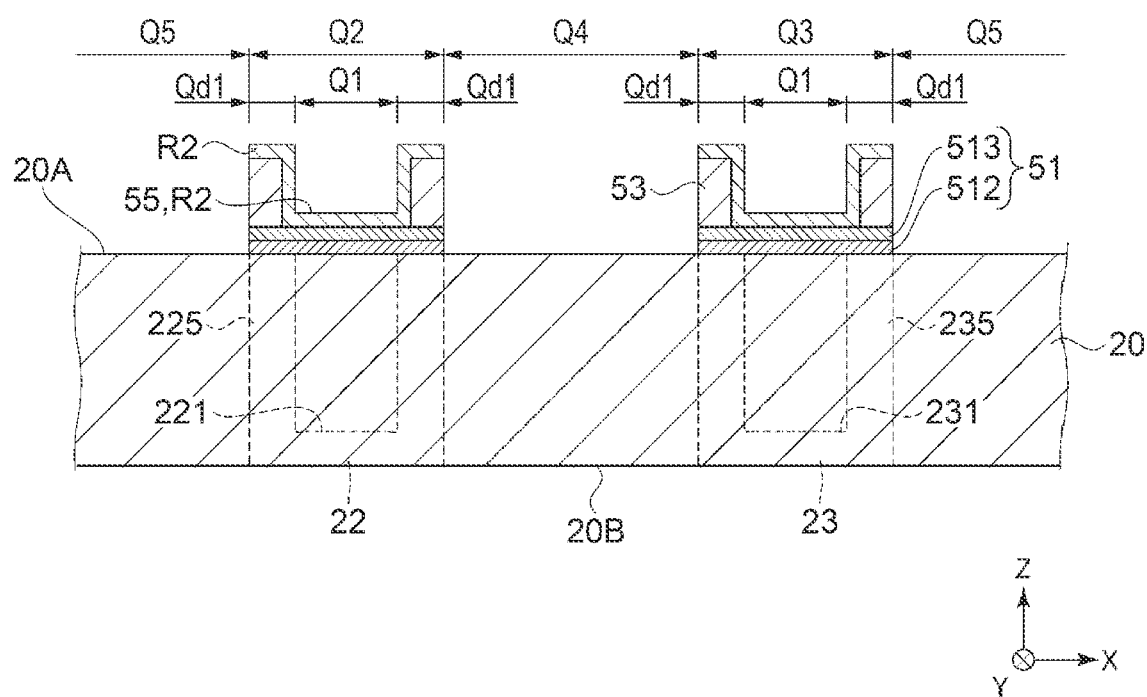
FIG. 15 is a cross-sectional view showing a method for manufacturing a vibration element according to a second embodiment.
Figure 16:
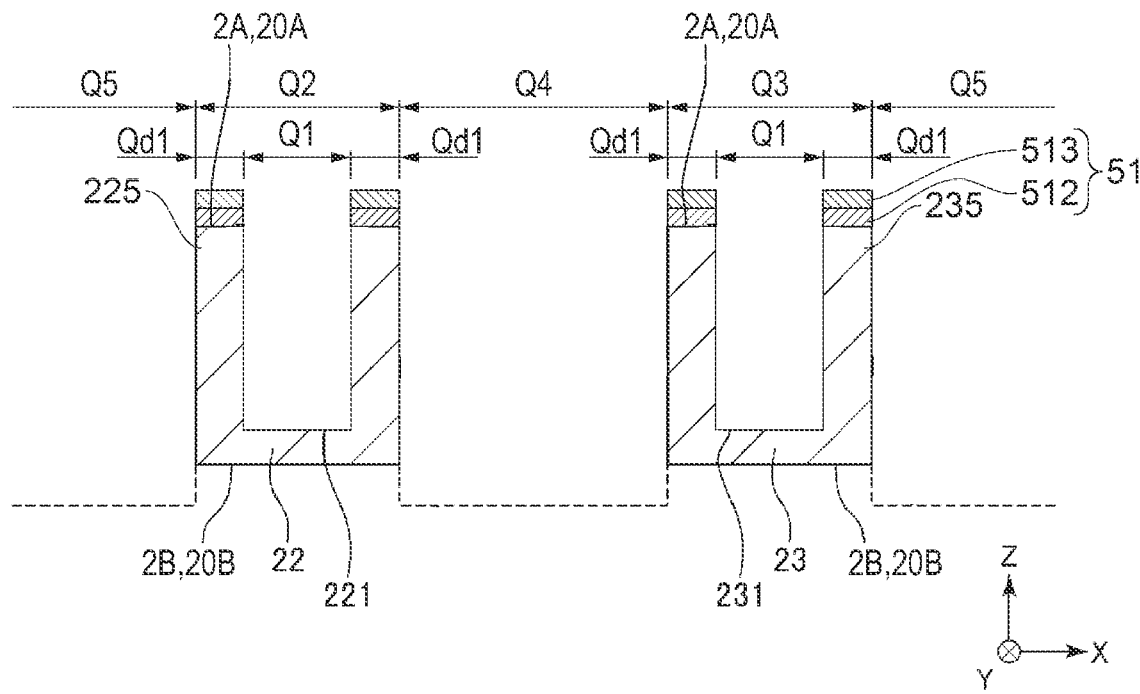
FIG. 16 is a cross-sectional view showing the method for manufacturing the vibration element.

First, as shown in FIG. 15, the second resist film R2 is formed in the first vibrating arm forming region Q2 and the second vibrating arm forming region Q3 of the surface of the first base film 51 on the side opposite to the quartz crystal substrate 20 by the photolithographic technique.

In the present embodiment, the step of forming the second resist film R2 in the base film patterning step S22 is included in the protective film forming step S3.

In the present embodiment, the second resist film R2 is formed of a resist material that is etched at a predetermined etching rate in the dry-etching step S4. The second resist film R2 is formed thinner than the first protective film 53. The second resist film R2 formed in the groove forming regions Q1 of the first vibrating arm forming region Q2 and the second vibrating arm forming region Q3 corresponds to the second protective film 55. In other words, in the protective film forming step S3, the second resist film R2 as the second protective film 55 thinner than the first protective film 53 is formed in the groove forming regions Q1 of the first base film 51.

Next, the first base film 51 is etched from a surface side of the first base film 51 on which the second resist film R2 is formed. As a result, the first base film 51 is formed in the first vibrating arm forming region Q2 and the second vibrating arm forming region Q3 on the first substrate surface 20A of the quartz crystal substrate 20.

Next, the second resist film R2 is not removed, and the process proceeds to the dry-etching step S4.

Dry-Etching Step S4

As shown in FIG. 15, in the dry-etching step S4, the dry-etching is started in the state where the second resist film R2 is formed. Other than this, the dry-etching step S4 is the same as that of the first embodiment.

The second resist film R2 is etched in the same manner as the first base film 51 and the first protective film 53 in the dry-etching step S4. Therefore, even when the second resist film R2 as the second protective film 55 is formed in the groove forming regions Q1, the outer shapes of the first and second vibrating arms 22, 23 and the grooves 221, 231 can be collectively formed in the dry-etching step S4 as shown in FIG. 16.

Even when the second resist film R2 is formed in the first vibrating arm forming region Q2 and the second vibrating arm forming region Q3, the outer shapes of the first and second vibrating arms 22, 23 and the grooves 221, 231 can be collectively formed in the dry-etching step S4, and thus a step of removing the second resist film R2 is not necessary. That is, the steps for manufacturing the vibration substrate 2 can be reduced.

When the dry-etching step S4 is ended, the process proceeds to the base film removing step S5. Since the base film removing step S5 and the electrode forming step S6 are the same as those of the first embodiment, the description thereof will be omitted.

According to the present embodiment, following effects can be obtained in addition to the effects of the first embodiment.

Even when the second resist film R2 as the second protective film 55 is formed in the groove forming regions Q1, the outer shapes of the first and second vibrating arms 22, 23 and the grooves 221, 231 can be collectively formed in the dry-etching step S4. In addition, the step of removing the second resist film R2 is not necessary, so that the steps for manufacturing the vibration substrate 2 can be reduced.

3. Third Embodiment

A method for manufacturing the vibration element 1 according to a third embodiment will be described with reference to FIGS. 17, 18, and 19. The same components as those of the first embodiment are denoted by the same reference numerals, and redundant description thereof will be omitted.

The third embodiment is the same as the first embodiment except that in the base film patterning step S22, the second metal film 513 is removed from the first base film 51 formed in the inter-arm region Q4 and the inter-element regions Q5, and the remaining first metal film 512 is used as a second base film 57.

In other words, the third embodiment is the same as the first embodiment except that the dry-etching in the dry-etching step S4 is started in a state where the first metal film 512 as the second base film 57 is formed in the inter-arm region Q4 and the inter-element regions Q5.

The preparing step S1, the base film coating step S21, the protective film coating step S31, and the protective film patterning step S32 are the same as those in the first embodiment, and thus the description thereof is omitted, and the method will be described from the base film patterning step S22.

Base Film Patterning Step S22

Figure 17:
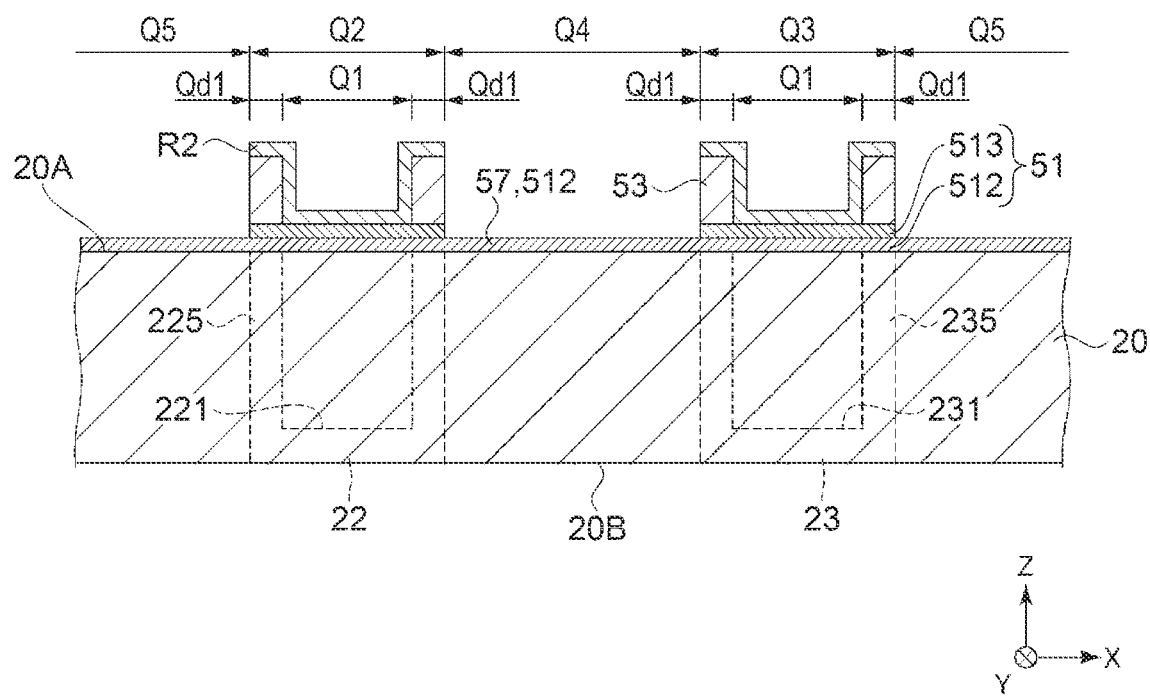
FIG. 17 is a cross-sectional view showing a method for manufacturing a vibration element according to a third embodiment.

First, as shown in FIG. 17, the second resist film R2 is formed in the first vibrating arm forming region Q2 and the second vibrating arm forming region Q3 of the surface of the first base film 51 on the side opposite to the quartz crystal substrate 20 by the photolithographic technique.

Next, the second metal film 513 of the first base film 51 is etched from the surface side of the first base film 51 on which the second resist film R2 is formed. As a result, the second metal film 513 in the inter-arm region Q4 and the inter-element regions Q5 where the second resist film R2 is not formed is removed. In addition, the first base film 51 is formed in the first vibrating arm forming region Q2 and the second vibrating arm forming region Q3 on the first substrate surface 20A of the quartz crystal substrate 20.

In the inter-arm region Q4 and the inter-element regions Q5, the second metal film 513 of the first base film 51 is removed, but the first metal film 512 is not removed. That is, the first metal film 512 is formed in the inter-arm region Q4 and the inter-element regions Q5 of the first substrate surface 20A of the quartz crystal substrate 20. The first metal film 512 formed in the inter-arm region Q4 and the inter-element regions Q5 of the first substrate surface 20A of the quartz crystal substrate 20 corresponds to the second base film 57. In other words, in the base film forming step S2, the first metal film 512 as the second base film 57 thinner than the first base film 51 is formed in the inter-arm region Q4 and the inter-element regions Q5 of the first substrate surface 20A.

Figure 18:
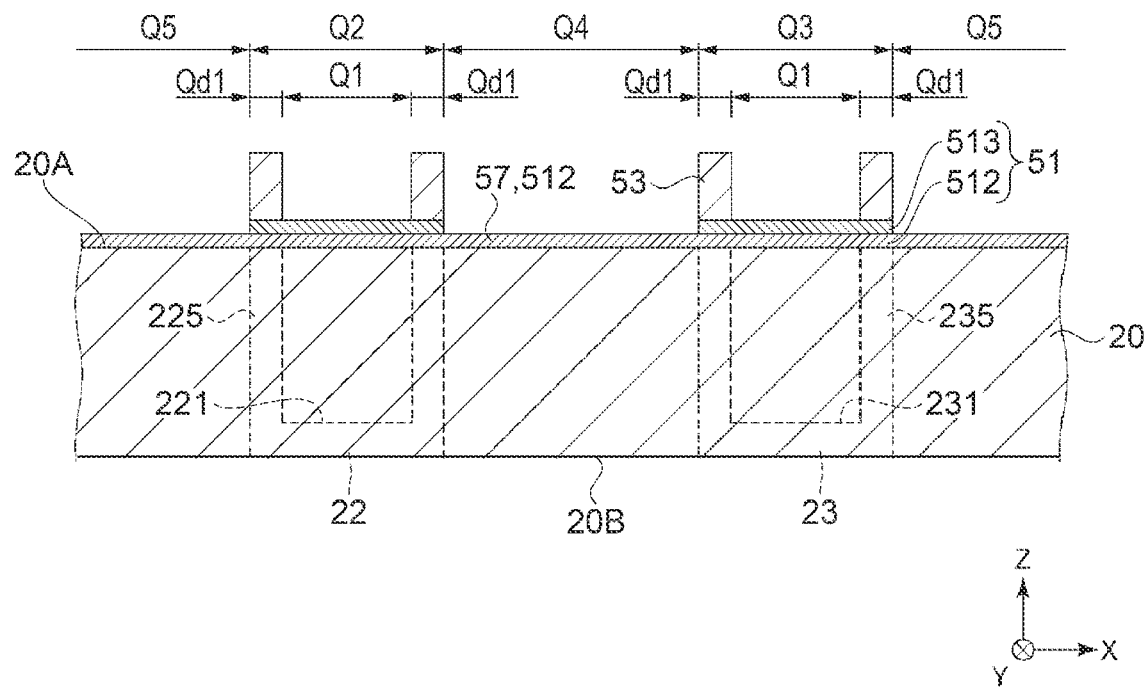
FIG. 18 is a cross-sectional view showing the method for manufacturing the vibration element.
Figure 19:
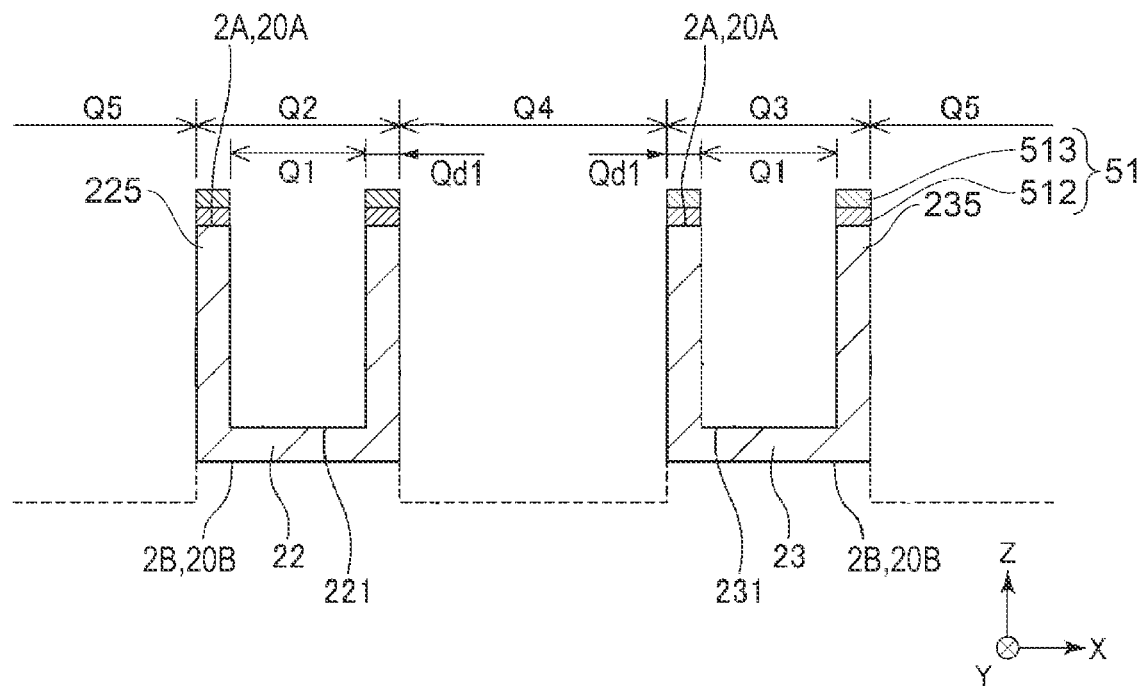
FIG. 19 is a cross-sectional view showing the method for manufacturing the vibration element.

Next, as shown in FIG. 18, the second resist film R2 formed in the first vibrating arm forming region Q2 and the second vibrating arm forming region Q3 is removed, and the process proceeds to the dry-etching step S4.

Dry-Etching Step S4

As shown in FIG. 18, in the dry-etching step S4, the dry-etching is started in the state where the first metal film 512 as the second base film 57 is formed in the inter-arm region Q4 and the inter-element regions Q5. Other than this, the dry-etching step S4 is the same as that of the first embodiment.

In the dry-etching step S4, the first metal film 512 as the second base film 57 is etched in the same manner as the first base film 51 and the first protective film 53. Therefore, even when the first metal film 512 as the second base film 57 is formed in the inter-arm region Q4 and the inter-element regions Q5, the outer shapes of the first and second vibrating arms 22, 23 and the grooves 221, 231 can be collectively formed in the dry-etching step S4 as shown in FIG. 19.

Even when the first metal film 512 is formed in the inter-arm region Q4 and the inter-element regions Q5, the outer shapes of the first and second vibrating arms 22, 23 and the grooves 221, 231 can be collectively formed, and thus the step of etching the first metal film 512 in the base film patterning step S22 is not necessary. That is, the steps for manufacturing the vibration substrate 2 can be reduced.

When the dry-etching step S4 is ended, the process proceeds to the base film removing step S5. Since the base film removing step S5 and the electrode forming step S6 are the same as those of the first embodiment, the description thereof will be omitted.

According to the present embodiment, following effects can be obtained in addition to the effects of the first embodiment.

Even when the first metal film 512 as the second base film 57 is formed in the inter-arm region Q4, the outer shapes of the first and second vibrating arms 22, 23 and the grooves 221, 231 can be collectively formed in the dry-etching step S4. In addition, the step of removing the first metal film 512 is not necessary, so that the steps for manufacturing the vibration substrate 2 can be reduced.

In the present embodiment, in the base film patterning step S22, the first metal film 512 as the second base film 57 is formed in the inter-arm region Q4 and the inter-element regions Q5 of the first substrate surface 20A of the quartz crystal substrate 20, but the first metal film 512 as the second base film 57 may not be formed. That is, as in the first embodiment described above, the first base film 51 may not be formed in the inter-arm region Q4 or the inter-element regions Q5 of the first substrate surface 20A. When the first base film 51 is not formed in the inter-arm region Q4 or the inter-element regions Q5 of the first substrate surface 20A, as compared with the case where the first metal film 512 as the second base film 57 is formed in the inter-arm region Q4 and the inter-element regions Q5, the dry-etching step S4 can be ended in a short time.

The method for manufacturing a vibration element according to the present disclosure has been described above based on the first embodiment, the second embodiment, and the third embodiment.

The vibration element manufactured by the method for manufacturing a vibration element according to the present disclosure is not particularly limited.

Figure 20:
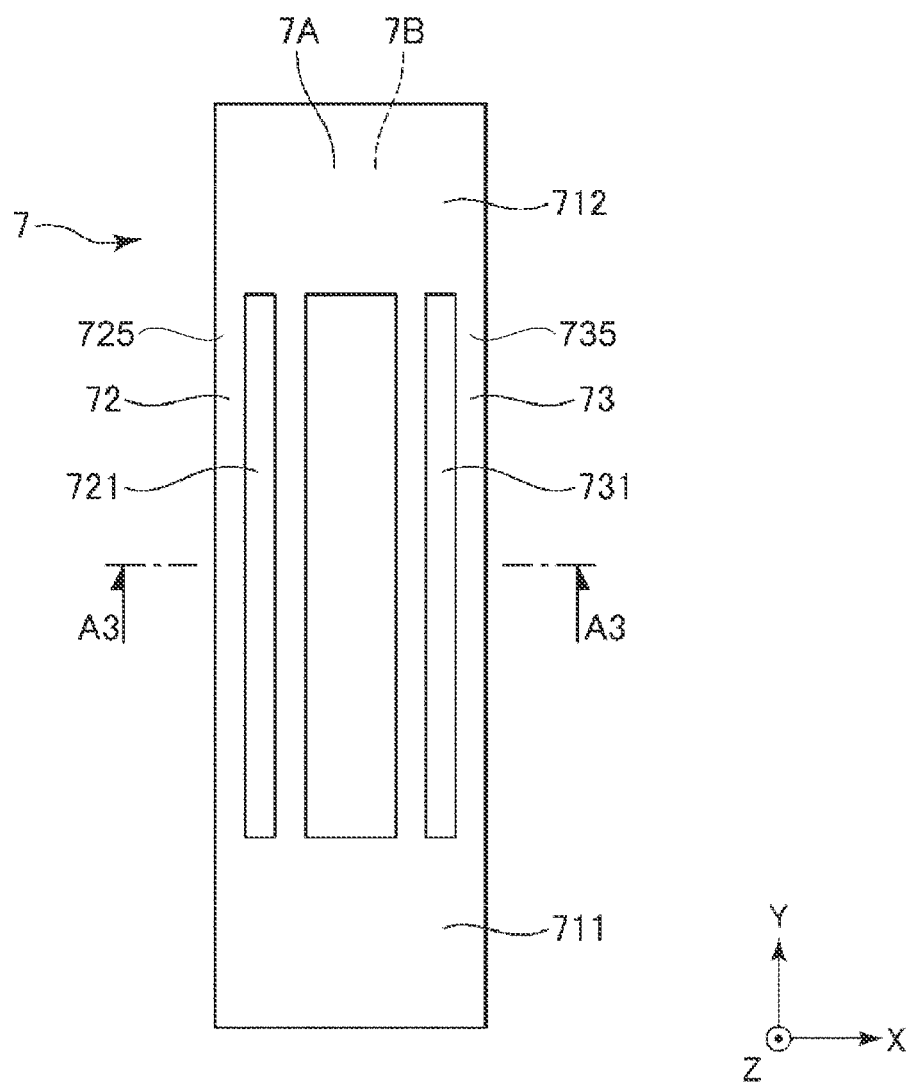
FIG. 20 is a plan view showing a modification of the vibration element.
Figure 21:
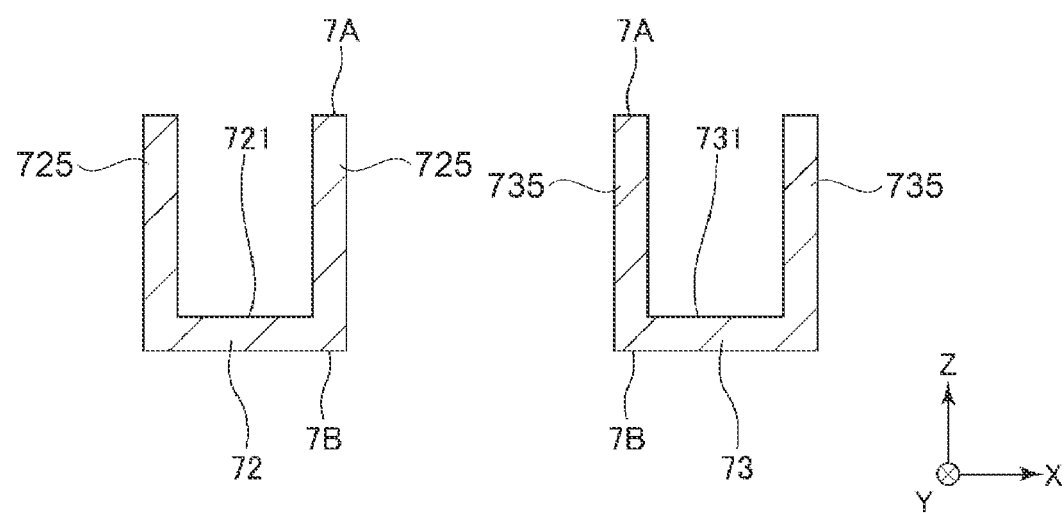
FIG. 21 is a cross-sectional view taken along a line A3-A3 in FIG. 20.

The vibration element manufactured by the method for manufacturing a vibration element according to the present disclosure may be, for example, a dual tuning fork type vibration element 7 as shown in FIGS. 20 and 21. Electrodes are not shown in FIGS. 20 and 21. The dual tuning fork type vibration element 7 includes a pair of base portions 711, 712, and a first vibrating arm 72 and a second vibrating arm 73 coupling the base portions 711, 712. The first vibrating arm 72 and the second vibrating arm 73 each have a first surface 7A and a second surface 7B in the front and back relationship. In addition, the first vibrating arm 72 and the second vibrating arm 73 respectively include bottomed grooves 721, 731 that open to the first surface 7A, and bank portions 725, 735 that demarcate the grooves 721, 731.

Figure 22:
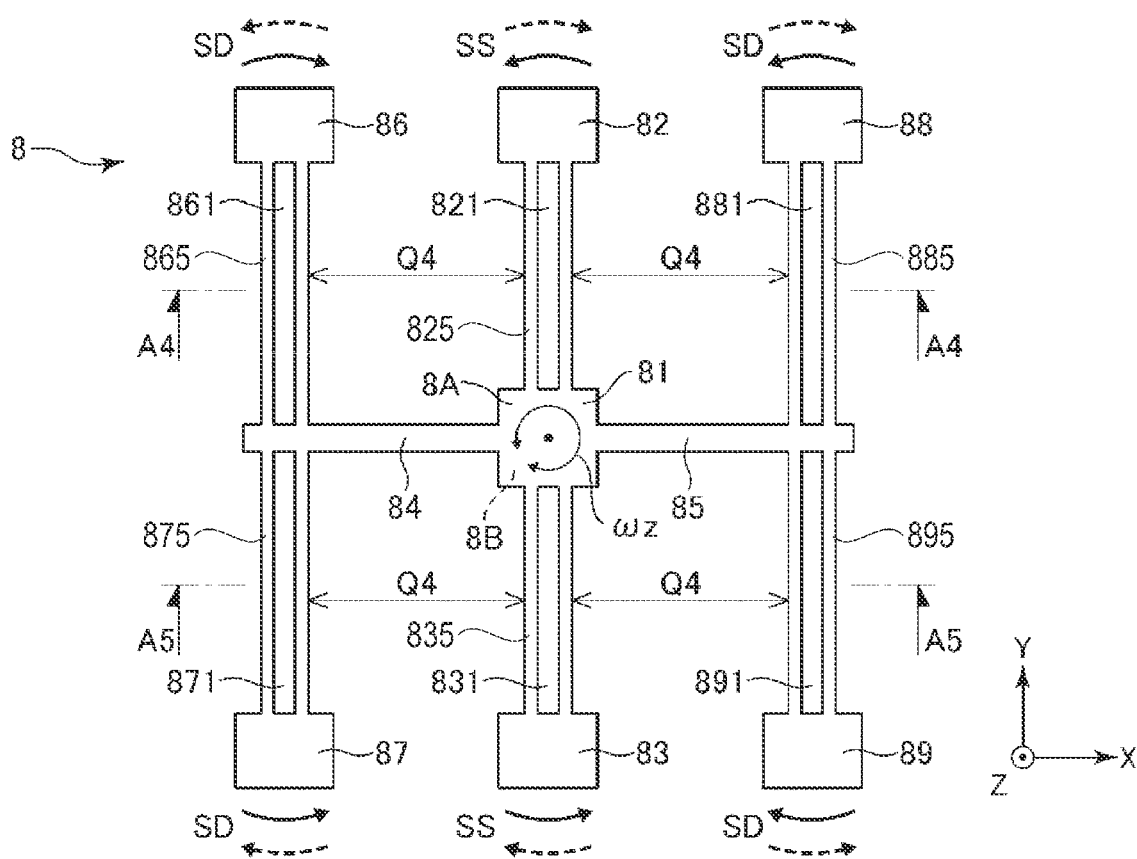
FIG. 22 is a plan view showing a modification of the vibration element.
Figure 23:
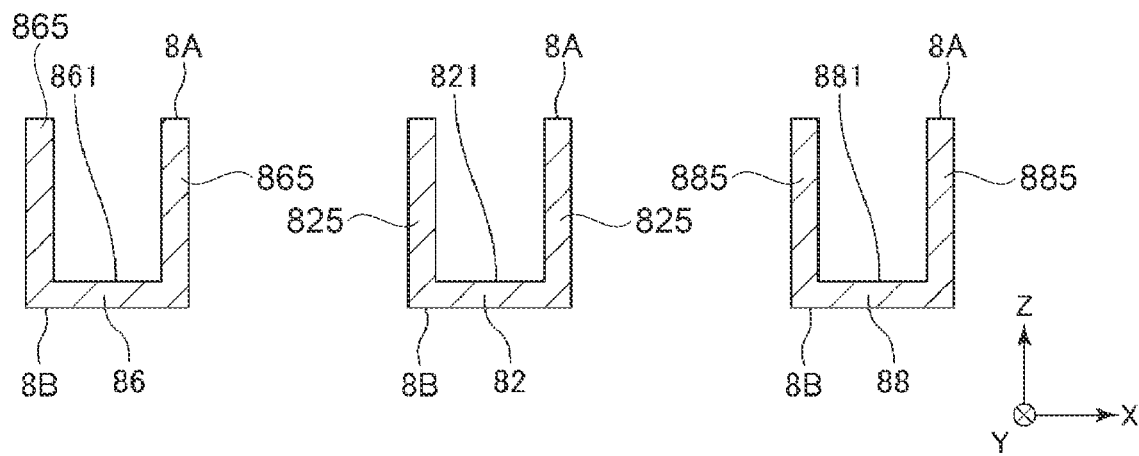
FIG. 23 is a cross-sectional view taken along a line A4-A4 in FIG. 22.
Figure 24:
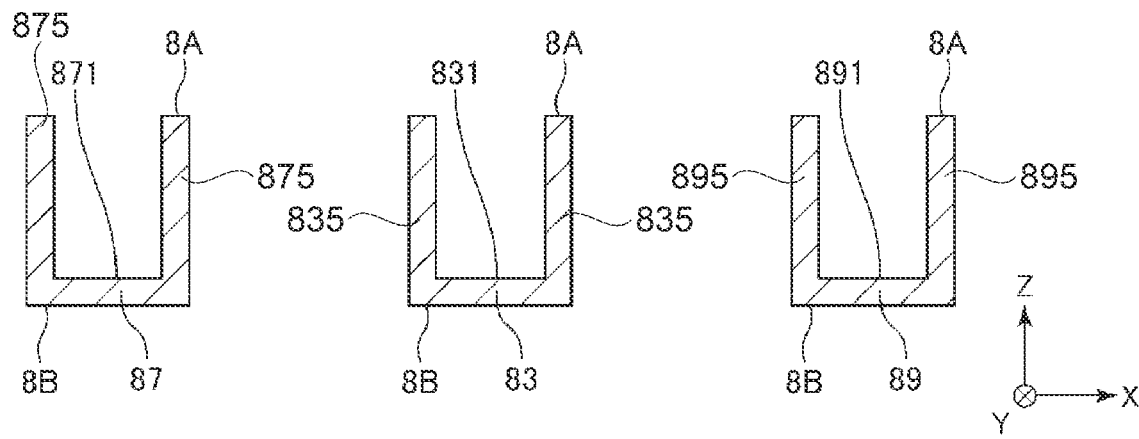
FIG. 24 is a cross-sectional view taken along a line A5-A5 in FIG. 22.

In addition, for example, the vibration element may be a gyro vibration element 8 as shown in FIGS. 22, 23, and 24. In FIGS. 22, 23, and 24, electrodes are not shown. The gyro vibration element 8 includes a base portion 81, a pair of detection vibration arms 82, 83 extending from the base portion 81 to both sides in the Y direction, a pair of coupling arms 84, 85 extending from the base portion 81 to both sides in the X direction, drive vibration arms 86, 87 extending from a tip end portion of the coupling arm 84 to both sides in the Y direction, and drive vibration arms 88, 89 extending from a tip end portion of the coupling arm 85 to both sides in the Y direction. In the gyro vibration element 8 described above, when an angular velocity ωz around the Z axis is applied in a state where the drive vibration arms 86, 87, 88, 89 perform flexural vibration in a direction of an arrow SD in FIG. 22, flexural vibration in a direction of an arrow SS is newly excited in the detection vibration arms 82, 83 by a Coriolis force, and the angular velocity ωz is detected based on electric charges output from the detection vibration arms 82, 83 by the flexural vibration.

The detection vibration arms 82, 83 and the drive vibration arms 86, 87, 88, 89 each have a first surface 8A and a second surface 8B in the front and back relationship. In addition, the detection vibration arms 82, 83 respectively include bottomed grooves 821, 831 that open to the first surface 8A, and bank portions 825, 835 that demarcate the grooves 821, 831. In addition, the drive vibration arms 86, 87, 88, 89 respectively include bottomed grooves 861, 871, 881, 891 that open to the first surface 8A, and bank portions 865, 875, 885, 895 that demarcate the grooves 861, 871, 881, 891. In the gyro vibration element 8 described above, for example, the drive vibration arms 86, 88 or the drive vibration arms 87, 89 are the first vibrating arms and the second vibrating arms.

Figure 25:
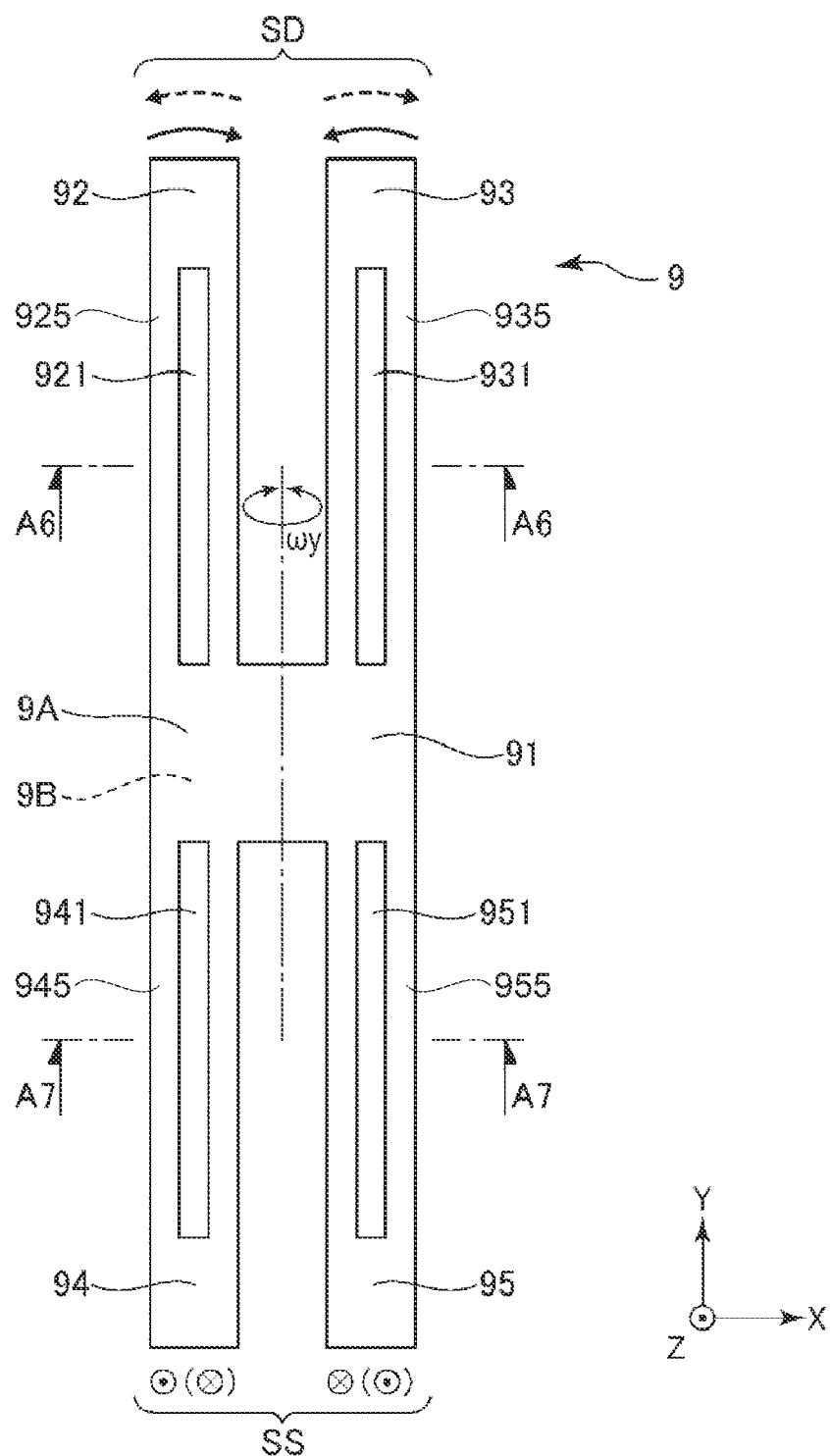
FIG. 25 is a plan view showing a modification of the vibration element.
Figure 26:
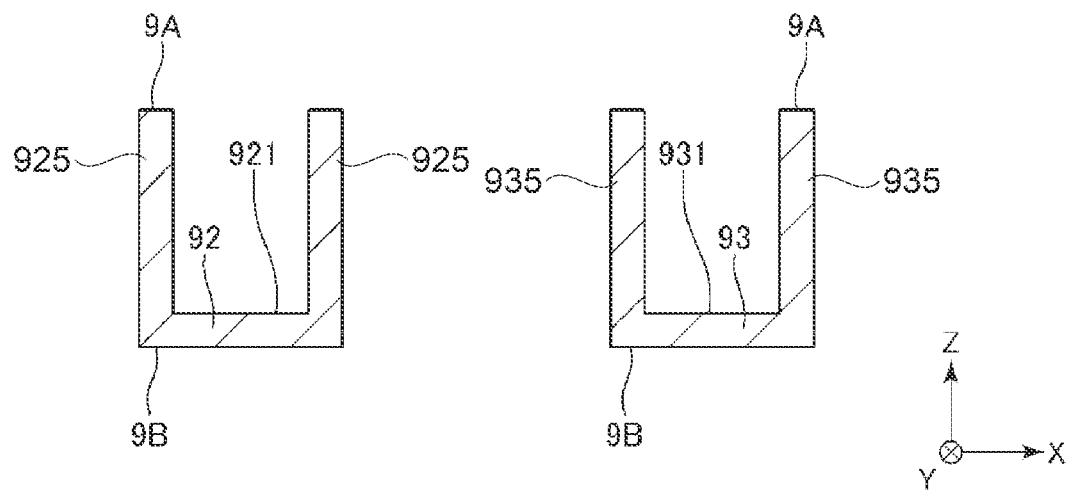
FIG. 26 is a cross-sectional view taken along a line A6-A6 in FIG. 25.
Figure 27:
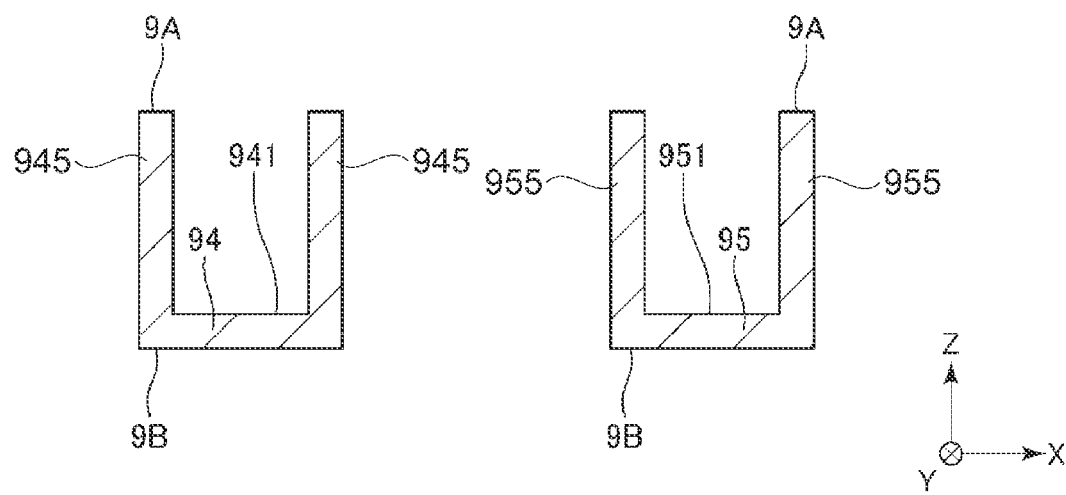
FIG. 27 is a cross-sectional view taken along a line A7-A7 in FIG. 25.

In addition, for example, the vibration element may be a gyro vibration element 9 as shown in FIGS. 25, 26, and 27. In FIGS. 25, 26, and 27, electrodes are not shown. The gyro vibration element 9 includes a base portion 91, a pair of drive vibration arms 92, 93 extending from the base portion 91 to the plus side in the Y direction and arranged side by side in the X direction, and a pair of detection vibration arms 94, 95 extending from the base portion 91 to the minus side in the Y direction and arranged side by side in the X direction. In the gyro vibration element 9 described above, when an angular velocity ωy around the Y axis is applied in a state where the drive vibration arms 92, 93 perform flexural vibration in a direction of an arrow SD in FIG. 25, flexural vibration in a direction of an arrow SS is newly excited in the detection vibration arms 94, 95 by a Coriolis force, and the angular velocity ωy is detected based on electric charges output from the detection vibration arms 94, 95 by the flexural vibration.

The drive vibration arms 92, 93 and the detection vibration arms 94, 95 each have a first surface 9A and a second surface 9B in the front and back relationship. In addition, the drive vibration arms 92, 93 respectively include bottomed grooves 921, 931 that open to the first surface 9A, and bank portions 925, 935 that demarcate the grooves 921, 931. In addition, the detection vibration arms 94, 95 respectively include bottomed grooves 941, 951 that open to the first surface 9A, and bank portions 945, 955 that demarcate the grooves 941, 951. In the gyro vibration element 9 described above, the drive vibration arms 92, 93 or the detection vibration arms 94, 95 are the first vibrating arms and the second vibrating arms.

What is claimed is:

1. A method for manufacturing a vibration element, wherein
    the vibration element includes a first vibrating arm and a second vibrating arm extending along a first direction and arranged side by side along a second direction intersecting the first direction,
    the first vibrating arm and the second vibrating arm each have a first surface and a second surface arranged side by side in a third direction intersecting the first direction and the second direction in a front and back relationship and a bottomed groove opening to the first surface,
    the method for manufacturing a vibration element comprising:
        a preparing step of preparing a quartz crystal substrate having a first substrate surface and a second substrate surface in a front and back relationship;
        a base film forming step of forming a first base film at the first substrate surface in a first vibrating arm forming region in which the first vibrating arm is to be formed and a second vibrating arm forming region in which the second vibrating arm is to be formed;
        a protective film forming step of forming a first protective film in a region of the first base film excluding a groove forming region in which the groove is to be formed; and
        a dry-etching step of dry-etching the quartz crystal substrate from a first substrate surface side through the first base film and the first protective film to form the first surfaces, the grooves, and outer shapes of the first vibrating arm and the second vibrating arm.

2. The method for manufacturing a vibration element according to claim 1, wherein in the protective film forming step, a second protective film thinner than the first protective film is formed in the groove forming region of the first base film.

3. The method for manufacturing a vibration element according to claim 1, wherein
in the base film forming step, a second base film thinner than the first base film is formed in an inter-arm region of the first substrate surface located between the first vibrating arm forming region and the second vibrating arm forming region.

4. The method for manufacturing a vibration element according to claim 1, wherein
the first base film is not formed in an inter-arm region of the first substrate surface located between the first vibrating arm forming region and the second vibrating arm forming region.

5. The method for manufacturing a vibration element according to claim 1, further comprising:
a base film removing step of removing, when the dry-etching in the dry-etching step is ended in a state where the first base film remains at the first substrate surface, the remaining first base film.

6. The method for manufacturing a vibration element according to claim 1, wherein
the first base film is a metal film.

* * * * *